United States Patent
Osada et al.

(10) Patent No.: US 9,198,332 B2
(45) Date of Patent: Nov. 24, 2015

(54) COOLING-TYPE SWITCHING ELEMENT MODULE

(71) Applicant: TOYOTA JIDOSHA KABUSHIKI KAISHA, Toyota-shi, Aichi-ken (JP)

(72) Inventors: Hiroshi Osada, Komaki (JP); Masanori Usui, Seto (JP); Takahide Sugiyama, Nagakute (JP); Tomoyuki Shoji, Nisshin (JP); Satoshi Hirose, Toyota (JP); Makoto Imai, Toyota (JP); Norimune Orimoto, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 184 days.

(21) Appl. No.: 14/145,451

(22) Filed: Dec. 31, 2013

(65) Prior Publication Data

US 2014/0198449 A1 Jul. 17, 2014

(30) Foreign Application Priority Data

Jan. 11, 2013 (JP) ................. 2013-003121

(51) Int. Cl.
*H05K 7/20* (2006.01)
*H01L 23/34* (2006.01)
*H01L 23/00* (2006.01)

(52) U.S. Cl.
CPC ............ *H05K 7/20927* (2013.01); *H01L 24/34* (2013.01); *H01L 2924/1305* (2013.01); *H01L 2924/13055* (2013.01)

(58) Field of Classification Search
CPC ............... H01L 24/34; H05K 7/20927; H05K 7/20872; H05K 7/20881; H05K 7/20981; H05K 7/2099; H05K 7/20936
USPC .......... 361/689, 717, 718; 257/107, 712, 714, 257/716, 717, 678
See application file for complete search history.

(56) References Cited

U.S. PATENT DOCUMENTS

| | | | |
|---|---|---|---|
| 6,255,672 B1 | 7/2001 | Yoshioka et al. | |
| 7,249,929 B2 * | 7/2007 | Cummings | ........... F01D 17/105 29/889.22 |
| 7,671,382 B2 * | 3/2010 | Sudo | .................. H01L 23/3121 257/181 |
| 7,687,901 B2 * | 3/2010 | Furuta | .................. H01L 23/367 257/712 |

(Continued)

FOREIGN PATENT DOCUMENTS

| | | |
|---|---|---|
| JP | 2000-049281 A | 2/2000 |
| JP | A-2001-128467 | 5/2001 |

(Continued)

*Primary Examiner* — Anthony Haughton
(74) *Attorney, Agent, or Firm* — Oliff PLC

(57) ABSTRACT

A cooling type switching element module includes an outer conductor pipe, an inner conductor pipe that transmits electric power in conjunction with the outer conductor pipe, and first and second switching elements. The first switching elements are provided on outer surfaces of the outer conductor pipe, and the second switching elements are provided on outer surfaces of a projecting portion of the inner conductor pipe. A coolant flows within the inner conductor pipe, and outside the outer conductor pipe. The first and second switching elements are cooled from both sides by the coolant flowing within the inner conductor pipe, and by the coolant flowing outside the outer conductor pipe. By employing the above-described structure, it is possible to provide a switching element module having a cooling function, in which improved cooling performance, improved electrical performance, and downsizing are achieved.

10 Claims, 17 Drawing Sheets

(56) References Cited

U.S. PATENT DOCUMENTS

| | | | | |
|---|---|---|---|---|
| 7,965,508 B2* | 6/2011 | Yamamoto | ............ | H01L 23/473 174/15.1 |
| 8,363,402 B2* | 1/2013 | Brunschwiler | ....... | H01L 23/473 165/80.4 |
| 8,390,131 B2* | 3/2013 | Fuchs | ................. | H01L 23/498 257/778 |
| 8,462,529 B2* | 6/2013 | Ward | ..................... | B60L 3/003 363/131 |
| 8,952,525 B2* | 2/2015 | Ide | ......................... | H01L 23/36 257/706 |
| 9,072,197 B2* | 6/2015 | Murata | ............ | H05K 7/202361 1/1 |
| 2001/0033477 A1 | 10/2001 | Inoue et al. | | |
| 2004/0189114 A1 | 9/2004 | Iwashima et al. | | |
| 2010/0182747 A1 | 7/2010 | Yoshida et al. | | |

FOREIGN PATENT DOCUMENTS

| | | |
|---|---|---|
| JP | A-2002-26215 | 1/2002 |
| JP | A-2004-297846 | 10/2004 |
| JP | A-2004-297847 | 10/2004 |
| JP | A-2007-116840 | 5/2007 |
| JP | 2007-335530 A | 12/2007 |
| JP | 2008-311496 A | 12/2008 |
| JP | 2012-239256 A | 12/2012 |

* cited by examiner

COOLING-TYPE SWITCHING ELEMENT MODULE

PRIORITY INFORMATION

This application claims priority to Japanese Patent Application No. 2013-003121, filed on Jan. 11, 2013, which is incorporated herein by reference in its entirety.

BACKGROUND

1. Technical Field

The present invention relates to a cooling-type switching element module, and, in particular, to a structure for causing a coolant to flow so as to cool switching elements.

2. Related Art

Electric-powered vehicles that travel using a motor generator, such as hybrid electric vehicles and electric vehicles, are widely used. Typically, an electric-powered vehicle incorporates an electric power conversion circuit that converts electric power between a motor generator and a secondary battery. The electric power conversion circuit includes, for example, a step-up/step-down converter for converting a voltage, and an inverter for converting direct current electric power to alternating current electric power.

Switching elements used in the electric power conversion circuit generate heat in response to switching operations. The electric power conversion circuit is therefore provided with a cooler for the switching elements. The cooler includes, for example, heat dissipation fins provided with channels through which a coolant flows. Typically, the greater the volume of the channels, the better the cooling performance. As such, when the cooling performance is improved, the cooler may be larger sized. Also, an inductance component included in a wiring conductor of the electric power conversion circuit may increase in magnitude depending on the arrangement of the switching elements. In consideration that such an inductance component may cause a surge voltage in the electric power conversion circuit and its surrounding electric circuits, the design and manufacturing costs for a high withstand voltage may increase. Further, when direct current electric power is converted to polyphase alternating current electric power, variations in electric constants may occur among phases depending on the arrangement of the switching elements, resulting in situations in which an alternating current voltage and an alternating current become unstable; for example, phase voltages and phase currents become nonuniform, or the neutral point potential varies. To address these problems, techniques such as those described in patent publications JP 2002-26215 A, JP 2004-297846 A, JP 2001-128467 A, and JP 2007-116840 A are being devised.

JP 2002-26215 A discloses a cooling fluid cooling-type semiconductor device. This device includes a plurality of flat cooling tubes and a plurality of semiconductor modules that are arranged in parallel. Each of the semiconductor modules is interposed in a gap between adjacent flat cooling tubes. This publication describes that cooling performance is improved by pinching two flat cooling tubes between which a semiconductor module is interposed, by means of a U-shaped spring component.

JP 2004-297846 A discloses an electric power conversion device including a cooler. This electric power conversion device is used for a motor, and the cooler is arranged around a drive shaft of the motor. An electric power semiconductor module for supplying electric power to the motor is attached on a cooling surface of the cooler. This publication describes that the above-described structure downsizes the electric power conversion device.

JP 2001-128467 A discloses an electric power conversion device that uses an intelligent power module (IPM). This electric power conversion device has an insulator interposed between a flat plate conductor connected to a positive electrode terminal of the IPM and a flat plate conductor connected to a negative electrode terminal of the IPM to form a smoothing capacitor between the positive electrode terminal and the negative electrode terminal. This publication describes that the above-described smoothing capacitor prevents a surging voltage from occurring in the circuit.

JP 2007-116840 A discloses an inverter module. In this inverter module, a plurality of insulating substrates on which switching elements are mounted are arranged in a circumferential direction at predetermined intervals with respect to the center axis of a cylindrical housing. Conductors connected to the insulating substrates are arranged within the plurality of insulating substrates. This publication describes that the above-described structure makes the lengths of the conductors equal, and downsizes the inverter module.

SUMMARY

None of the techniques disclosed in the above-described patent publications simultaneously achieves all of improved cooling performance, downsizing, and improved electrical performance. Further, because the devices disclosed in the above-described patent publications have different structures, it is difficult to simply combine the techniques disclosed in the above-described patent publications.

An object of the present invention is to provide a switching element module having a cooling function, in which improved cooling performance, improved electrical performance, and downsizing are achieved.

According to one aspect of the present invention, there is provided a cooling-type switching element module comprising an outer conductor pipe; an inner conductor pipe that is at least partially located within the outer conductor pipe, and transmits electric power in conjunction with the outer conductor pipe; and a plurality of first switching elements and a plurality of second switching elements, wherein the inner conductor pipe has a projecting portion that projects from an opening of the outer conductor pipe, each of the first switching elements is provided on an outer surface of the outer conductor pipe, each of the second switching elements is provided on an outer surface of the projecting portion, and a coolant flows within the inner conductor pipe, outside the projecting portion, and outside the outer conductor pipe.

Further, it is preferable that the cooling-type switching element module according to the present invention further comprises a conductor having one of the first switching elements interposed between the conductor and the outer conductor pipe, and having one of the second switching elements interposed between the conductor and the projecting portion.

According to another aspect of the present invention, there is provided a cooling-type switching element module comprising an outer conductor pipe; an inner conductor pipe that is located within the outer conductor pipe, and transmits electric power in conjunction with the outer conductor pipe; and a plurality of first switching elements and a plurality of second switching elements, wherein the outer conductor pipe has an extension portion that is extended from a position located on one end of the inner conductor pipe, each of the first switching elements is provided on an inner surface of the extension portion, each of the second switching elements is provided on an inner surface of the inner conductor pipe, and a coolant flows within the inner conductor pipe, within the extension portion, and outside the outer conductor pipe.

Further, it is preferable that the cooling-type switching element module according to the present invention further comprises a conductor having one of the first switching elements interposed between the conductor and the extension portion, and having one of the second switching elements interposed between the conductor and the inner conductor pipe.

Further, in the cooling-type switching element module according to the present invention, it is preferable that there are a plurality of switching element pairs, each pair composed of one of the first switching elements and one of the second switching elements, the first switching element and the second switching element in each switching element pair are aligned in a longitudinal direction of the outer conductor pipe and the inner conductor pipe, and the plurality of switching element pairs are arranged in a circumferential direction of the inner conductor pipe and the outer conductor pipe with the first switching element and the second switching element forming each pair being arranged in the same direction.

Further, in the cooling-type switching element module according to the present invention, it is preferable that each of the outer conductor pipe and the inner conductor pipe has a polygonal column shape, and one of the switching element pairs is provided on one flat side surface of the outer conductor pipe and the inner conductor pipe.

Further, in the cooling-type switching element module according to the present invention, it is preferable that the switching element pairs comprise a plurality of switching element pairs constituting a first inverter; and a plurality of switching element pairs constituting a second inverter, wherein the switching element pairs constituting the first inverter and the switching element pairs constituting the second inverter are provided on adjacent flat side surfaces of the outer conductor pipe and the inner conductor pipe.

By employing the present invention, it is possible to provide a switching element module having a cooling function, in which improved cooling performance, improved electrical performance, and downsizing are achieved.

BRIEF DESCRIPTION OF THE DRAWINGS

Preferred embodiments of the present invention will be described in detail by reference to the following figures, wherein.

DETAILED DESCRIPTION

Figure 1:
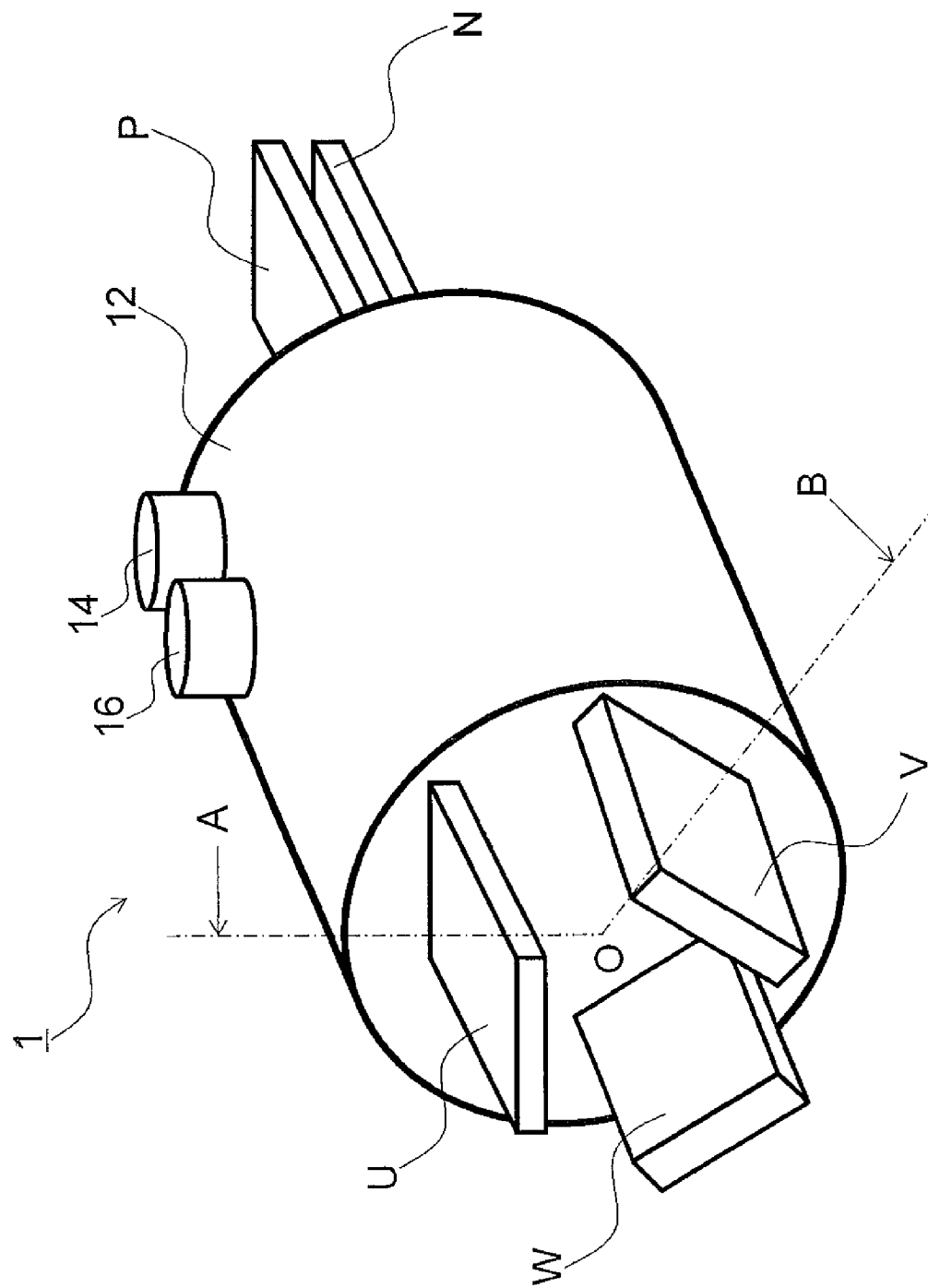
FIG. 1 is a perspective view of a cooling-type switching element module according to a first embodiment.

FIG. 1 shows a perspective view of a cooling-type switching element module 1 according to a first embodiment of the present invention. In the cooling-type switching element module 1, an inverter having a plurality of switching elements is housed in a cylindrical housing 12. A positive electrode conductor P and a negative electrode conductor N for transmitting direct current electric power extend from one end of the housing 12. A U phase conductor, a V phase conductor, and a W phase conductor for transmitting three-phase alternating current electric power extend from the other end of the housing 12. Each of these conductors is formed of a metal strip, and is also referred to as a bus bar.

A coolant inlet 14 and a coolant outlet 16 are provided on the side surface of the housing 12. A coolant for cooling the switching elements enters through the coolant inlet 14. The coolant cools the switching elements provided in the housing 12, and then exits through the coolant outlet 16.

Figure 2:
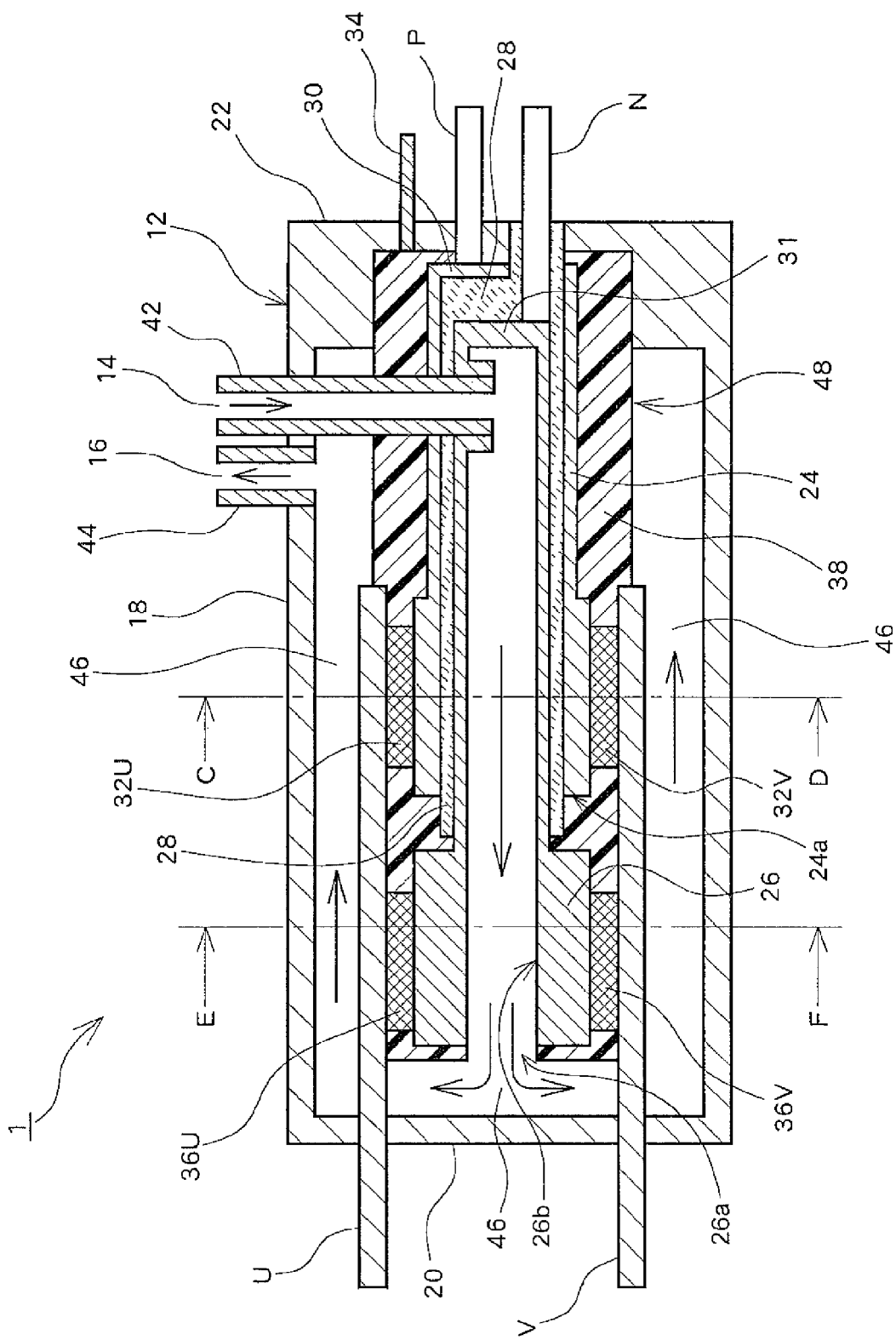
FIG. 2 is a cross-sectional view of the cooling-type switching element module according to the first embodiment.
Figure 3:
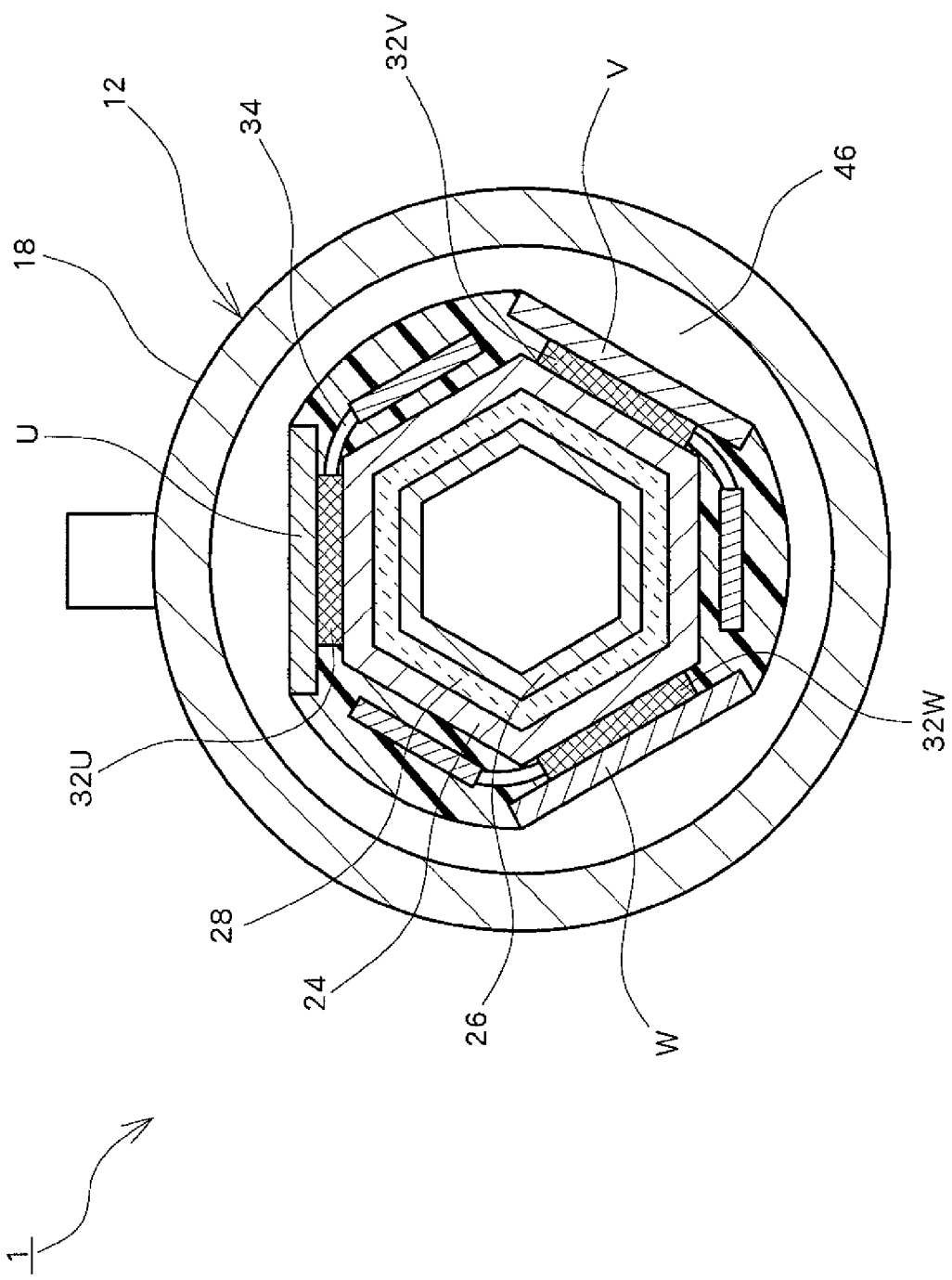
FIG. 3 is a cross-sectional view of the cooling-type switching element module according to the first embodiment.
Figure 4:
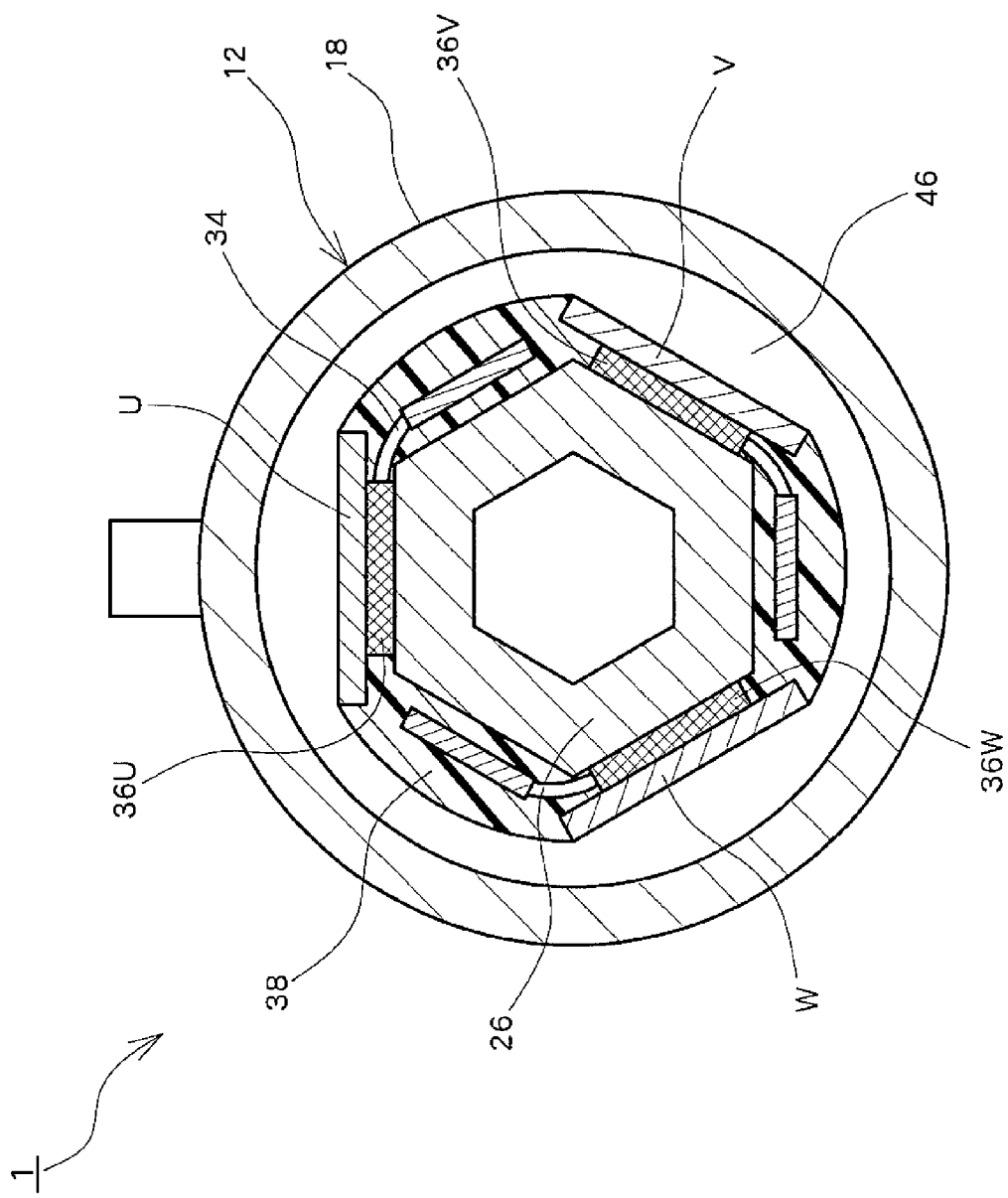
FIG. 4 is a cross-sectional view of the cooling-type switching element module according to the first embodiment.

FIG. 2 shows a cross-sectional view taken along line AOB in FIG. 1. FIGS. 3 and 4 respectively show cross-sectional views taken along lines CD and EF in FIG. 2.

As shown in FIG. 2, the housing 12 includes a cylindrical pipe portion 18, a first lid portion 20 that covers one end of the pipe portion 18, and a second lid portion 22 that covers another end of the pipe portion 18. The housing 12 is formed of, for example, metal such as iron or aluminum, or an insulator such as ceramic. Although in this example the housing 12 has a cylindrical shape, the housing 12 may have a different polygonal column shape.

An outer conductor pipe 24 and an inner conductor pipe 26 are arranged within the housing 12 to share the same axis with the pipe portion 18. The outer conductor pipe 24 and the inner conductor pipe 26 have a hexagonal column shape, and are arranged such that the side surfaces are parallel to each other. An insulating layer 28 is provided between the outer conductor pipe 24 and the inner conductor pipe 26. For the insulating layer 28, a material having high withstand voltage and high thermal conductivity is used, such as aluminum nitride, aluminum oxide, or mica. The right end of the outer conductor pipe 24 is covered by an outer conductor plate 30, and the right end of the inner conductor pipe 26 is covered by an inner conductor plate 31. The right side of the inner conductor pipe 26 is located within the outer conductor pipe 24, and a remaining portion of the inner conductor pipe 26 projects to the left side from an opening 24a of the outer conductor pipe 24. The remaining portion is a projecting portion 26b. As will be described below, the switching elements are arranged at predetermined positions near the openings 24a, 26a of the outer conductor pipe 24 and the inner conductor pipe 26, and a greater thickness is provided in an outward direction near the openings 24a, 26a of the outer conductor pipe 24 and the inner conductor pipe 26 than in other portions.

The positive electrode conductor P pierces the second lid portion 22 of the housing 12, and is joined to the outer conductor plate 30. When the second lid portion 22 is formed of a conductive material, the positive electrode conductor P and the second lid portion 22 are electrically insulated from each other. In this case, an insulator material is provided between the positive electrode conductor P and the second lid portion 22. Also, the negative electrode conductor N pierces the second lid portion 22 and the outer conductor plate 30, and is joined to the inner conductor plate 31. The insulating layer 28 is provided between the negative electrode conductor N and the outer conductor pipe 24, and between the negative electrode conductor N and the second lid portion 22. When the second lid portion 22 is formed of an insulator, the negative electrode conductor N and the second lid portion 22 may directly contact each other.

As shown in FIG. 3, first switching elements 32U, 32V, and 32W are arranged on every other side surface of the hexagonal column shape (three side surfaces that are not adjacent to each other) of a portion of the outer conductor pipe 24 that forms a double-layer structure in conjunction with the inner conductor pipe 26. When this hexagonal column shape is a regular hexagonal column shape, the first switching elements 32U, 32V, and 32W are arranged at intervals of 120°. Each first switching element is plate-shaped, and has flat terminals on both plate surfaces. Also, a control line 34 extends from a side surface of each first switching element. One of the plate surfaces of each first switching element faces a side surface of the outer conductor pipe 24, and is attached to the side surface of the outer conductor pipe 24. The terminal of each first switching element that is located closer to the outer conductor pipe 24 is electrically connected to the side surface of the outer conductor pipe 24 by soldering or another method.

As the first switching elements 32U, 32V, and 32W, for example, an insulated gate bipolar transistor (IGBT) is used. In this case, the plate surface on which a collector terminal is provided faces the outer conductor pipe 24, and the plate surface on which an emitter terminal is provided faces opposite the outer conductor pipe 24 side.

As shown in FIG. 4, second switching elements 36U, 36V, and 36W are arranged on every other side surface of the hexagonal column shape of the inner conductor pipe 26. When this hexagonal column shape is a regular hexagonal column shape, the second switching elements 36U, 36V, and 36W are arranged at intervals of 120°. Each second switching element is plate-shaped, and has flat terminals on both plate surfaces. Also, a control line 34 extends from a side surface of each second switching element. One of the plate surfaces of each second switching element faces a side surface of the inner conductor pipe 26, and is attached to the side surface of the inner conductor pipe 26. The terminal of each second switching element that is located closer to the inner conductor pipe 26 is electrically connected to the side surface of the inner conductor pipe 26 by soldering or another method.

As the second switching elements 36U, 36V, and 36W, for example, an IGBT is used. In this case, the plate surface on which an emitter terminal is provided faces the inner conductor pipe 26, and the plate surface on which a collector terminal is provided faces opposite the inner conductor pipe 26 side.

As shown in FIG. 2, the U phase first switching element 32U and the U phase second switching element 36U are aligned in a longitudinal direction of the outer conductor pipe 24 and the inner conductor pipe 26. Similarly, the V phase first switching element 32V and the V phase second switching element 36V are also aligned in the longitudinal direction of the outer conductor pipe 24 and the inner conductor pipe 26, and the W phase first switching element 32W and the W phase second switching element 36W are also aligned in the longitudinal direction of the outer conductor pipe 24 and the inner conductor pipe 26. In the following description, the plate surfaces of the first switching elements 32U, 32V, and 32W that face the inside direction of the conductor pipes 24 and 26 are referred to as inner surfaces, and the plate surfaces on the opposite side are referred to as outer surfaces. Also, the plate surfaces of the second switching elements 36U, 36V, and 36W that face the inside direction of the conductor pipes 24 and 26 are referred to as inner surfaces, and the plate surfaces on the opposite side are referred to as outer surfaces.

The U phase conductor is attached to the outer surfaces of the U phase first switching element 32U and the U phase second switching element 36U. In other words, the U phase first switching element 32U is interposed between the U phase conductor and the outer conductor pipe 24, and the U phase second switching element 36U is interposed between the U phase conductor and the projecting portion of the inner conductor pipe 26. The U phase conductor is electrically connected to the terminals provided on the outer surfaces of the U phase first switching element 320 and the U phase second switching element 36U by soldering or another method.

The V phase conductor is attached to the outer surfaces of the V phase first switching element 32V and the V phase second switching element 36V. In other words, the V phase first switching element 32V is interposed between the V phase conductor and the outer conductor pipe 24, and the V phase second switching element 36V is interposed between the V phase conductor and the projecting portion of the inner conductor pipe 26. The V phase conductor is electrically connected to the terminals provided on the outer surfaces of the V phase first switching element 32V and the V phase second switching element 36V by soldering or another method.

The W phase conductor is attached to the outer surfaces of the W phase first switching element 32W and the W phase second switching element 36W. In other words, the W phase first switching element 32W is interposed between the W phase conductor and the outer conductor pipe 24, and the W phase second switching element 36W is interposed between the W phase conductor and the projecting portion of the inner conductor pipe 26. The W phase conductor is electrically connected to the terminals provided on the outer surfaces of the W phase first switching element 32W and the W phase second switching element 36W by soldering or another method.

The U phase conductor, the V phase conductor, and the W phase conductor are elongated in the left direction, and pierce the first lid portion 20 to extend to the outside of the housing 12. When the first lid portion 20 is formed of a conductive material, the phase conductors and the first lid portion 20 are electrically insulated from each other. In this case, an insulator material is provided between the phase conductors and the first lid portion 20.

The control lines 34 for the first switching elements 32U, 32V, and 32W and the second switching elements 36U, 36V, and 36W are elongated in the right direction, and pierce the second lid portion 22 to extend to the outside of the housing 12. When the second lid portion 22 is formed of a conductive material, the control lines 34 and the second lid portion 22 are electrically insulated from each other. In this case, an insulator material is provided between the control lines 34 and the second lid portion 22.

The outer conductor pipe 24, the inner conductor pipe 26, the insulating layer 28, the first switching elements 32U, 32V, and 32W, the second switching elements 36U, 36V, and 36W, and the phase conductors are molded by a molding resin 38, and integrated as a molded body 48. As the molding resin 38, a heat-resistant and thermally conductive material such as an epoxy resin is used. The thickness of a right end portion of the side wall of the pipe portion 18 is increased in an inward direction to reduce the inner diameter. The molded body 48 is attached to the housing 12 at a portion in which the inner diameter in the right end of the pipe portion 18 is reduced. Further, a coolant flow channel 46 through which a coolant flows is formed in a region between the molded body 48 and the housing 12.

Figure 5:
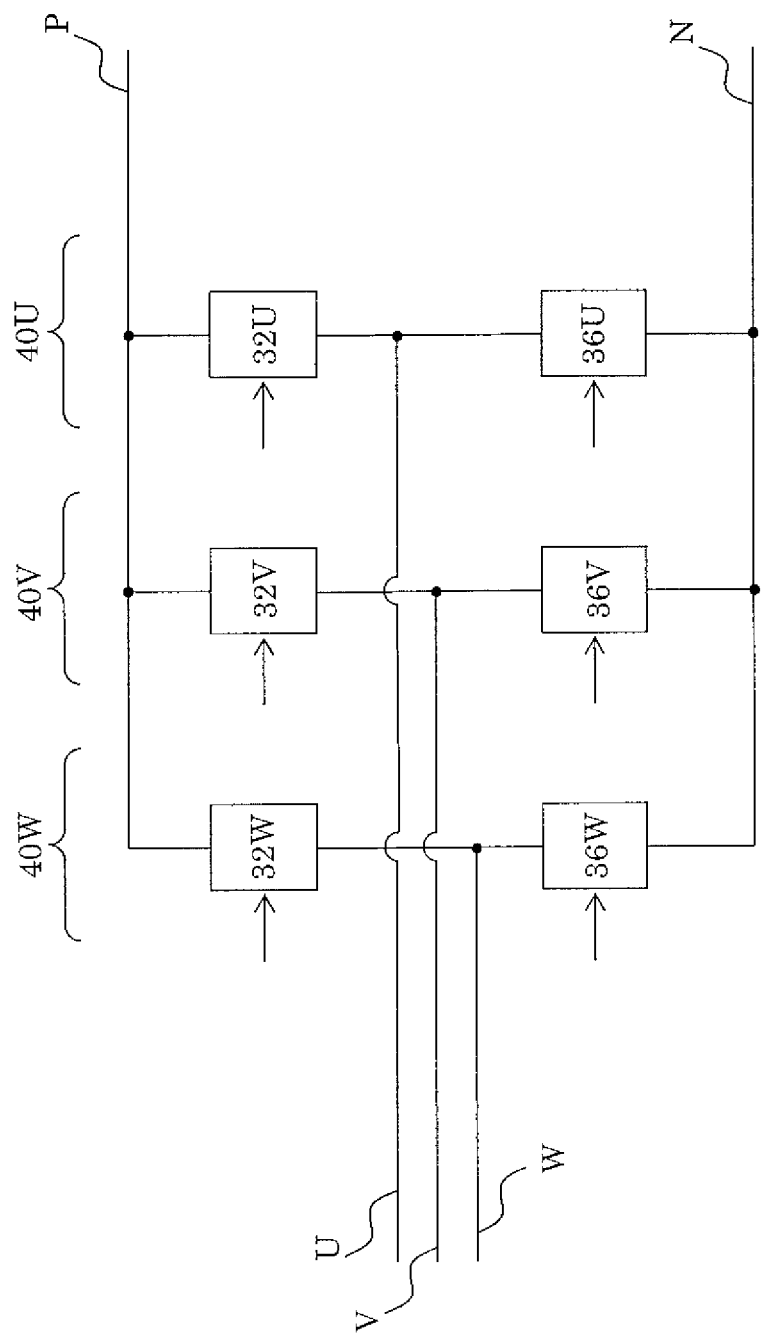
FIG. 5 is a circuit diagram of an inverter.

FIG. 5 shows a circuit diagram of an inverter included in the cooling-type switching element module 1. Components identical to those shown in FIGS. 1 to 4 are denoted by the same reference numerals. The inverter includes switching element pairs 40U, 40V, and 40W respectively corresponding to the U phase conductor, the V phase conductor, and the W phase conductor. The U phase switching element pair 40U is a pair consisting of the U phase first switching element 32U and the U phase second switching element 36U, the V phase switching element pair 40V is a pair consisting of the V phase first switching element 32V and the V phase second switching element 36V, and the W phase switching element pair 40W is a pair consisting of the W phase first switching element 32W and the W phase second switching element 36W. Each of the first switching elements 32U, 32V, and 32W has one end connected to the positive electrode conductor P, and has another end connected to respective one end of each of the second switching elements 36U, 36V, and 36W that pair with the first switching elements 32U, 32V, and 32W. Another end of each of the second switching elements 36U, 36V, and 36W is connected to the negative electrode conductor N. The U phase conductor, the V phase conductor, and the W phase conductor are respectively connected to connection nodes between the first switching elements 32U, 32V, and 32W and the second switching elements 36U, 36V, and 36W of the corresponding switching element pairs. When IGBTs are used as the first switching elements 32U, 32V, and 32W and the second switching elements 36U, 36V, and 36W, the circuit is configured such that a terminal on the upper side of each switching element is a collector terminal, and a terminal on the lower side of each switching element is an emitter terminal. Further, the control lines 34 are respectively connected to gate terminals of the first switching elements 32U, 32V, and 32W and the second switching elements 36U, 36V, and 36W.

A direct current voltage corresponding to direct current electric power transmitted by the positive electrode conductor P and the negative electrode conductor N is converted into a three-phase alternating current voltage through switching operations of the switching element pairs 40U, 40V, and 40W. The U phase voltage, the V phase voltage, and the W phase voltage are respectively output to the U phase conductor, the V phase conductor, and the W phase conductor. The U phase conductor, the V phase conductor, and the W phase conductor transmit three-phase alternating current electric power corresponding to the three-phase alternating current voltage.

Further, when each switching element includes a rectifying element, the three-phase alternating current voltage corresponding to the three-phase alternating current electric power transmitted by the U phase conductor, the V phase conductor, and the W phase conductor is converted into a direct current voltage through the rectification of the switching elements. The positive electrode conductor P and the negative electrode conductor N transmit direct current electric power corresponding to the direct current voltage.

A structure for causing a coolant to flow will be described below with reference to FIG. 2. As the coolant, for example, a fluorine-based liquid such as Fluorinert®, or water may be used. Also, a gas may be used as the coolant. When the wall surface of the channel through which the coolant flows in the cooling-type switching element module 1 is subjected to an insulation treatment, an electrically conductive coolant may be used. An inlet tube 42 is inserted through the side surface of the housing 12. The inlet tube 42 pierces the side wall of the pipe portion 18, the coolant flow channel 46, the molding resin 38, the side wall of the outer conductor pipe 24, and the side wall of the inner conductor pipe 26, and communicates with the inside of the inner conductor pipe 26. Further, an outlet tube 44 is inserted through the side surface of the housing 12, and communicates with the coolant flow channel 46. One end of the inlet tube 42 that is present outside the housing 12 forms the coolant inlet 14, and one end of the outlet tube 44 that is present outside the housing 12 forms the coolant outlet 16.

The coolant that has entered through the coolant inlet 14 passes through the inlet tube 42, and reaches the inside of the inner conductor pipe 26. The coolant passes through the inside of the inner conductor pipe 26 while absorbing heat from the first switching elements 32U, 32V, and 32W and the second switching elements 36U, 36V, and 36W of the switching element pairs 40U, 40V, and 40W, and reaches the coolant flow channel 46 through the inner conductor pipe 26. The coolant passes through the coolant flow channel 46 that is present between the first lid portion 20 and the molded body 48, and reaches the coolant flow channel 46 that is present between the pipe portion 18 and the molded body 48. The coolant passes through the coolant flow channel 46 that is present between the pipe portion 18 and the molded body 48 while absorbing heat from the second switching elements 36U, 36V, and 36W and the first switching elements 32U, 32V, and 32W of the switching element pairs 40U, 40V, and 40W, and then passes through the outlet tube 44 to be emitted through the coolant outlet 16. It should be noted that the coolant may flow in the reverse direction.

In the above-described embodiment, a voltage applied to the positive electrode conductor P and the negative electrode conductor N is applied to the switching element pairs 40U, 40V, and 40W via the outer conductor pipe 24 and the inner conductor pipe 26. The outer conductor pipe 24 and the inner conductor pipe 26 are opposed to each other in close proximity with the insulating layer 28 being interposed therebetween over a large area. As a result, the capacitance between the outer conductor pipe 24 and the inner conductor pipe 26 is increased, and respective inductance components are decreased. This prevents a surge voltage from occurring in the inverter.

Further, the lengths of the current paths from the positive electrode conductor P and the negative electrode conductor N to the switching element pairs 40U, 40V, and 40W for the respective phases are uniform for the respective phases. This reduces variations in electric constants (such as parasitic inductances, parasitic capacitances, or loss resistances) between the phases, and prevents the nonuniformity of phase voltages and phase currents.

Further, the first switching elements 32U, 32V, and 32W and the second switching elements 36U, 36V, and 36W of the switching element pairs 40U, 40V, and 40W are cooled from both sides by the coolant flowing within the inner conductor pipe 26, and by the coolant flowing through the coolant flow channel 46. This reduces thermal resistance with respect to the same rate of coolant flow, and enhances the cooling effect. The switching element pairs for the respective phases are arranged along the circumferential direction of the outer conductor pipe 24 and the inner conductor pipe 26. This prevents variations in cooling performance between the phases.

Further, the feature of arranging the switching elements 32U, 32V, 32W, 36U, 36V, and 36W on the outer conductor pipe 24 and the inner conductor pipe 26 which transmit direct current electric power, and through which a coolant flows, eliminates wasted space, and downsizes the cooling-type switching element module. Also, because the structure for electric power transmission and cooling is integrated within the housing 12, the number of components and the costs are reduced.

Figure 6:
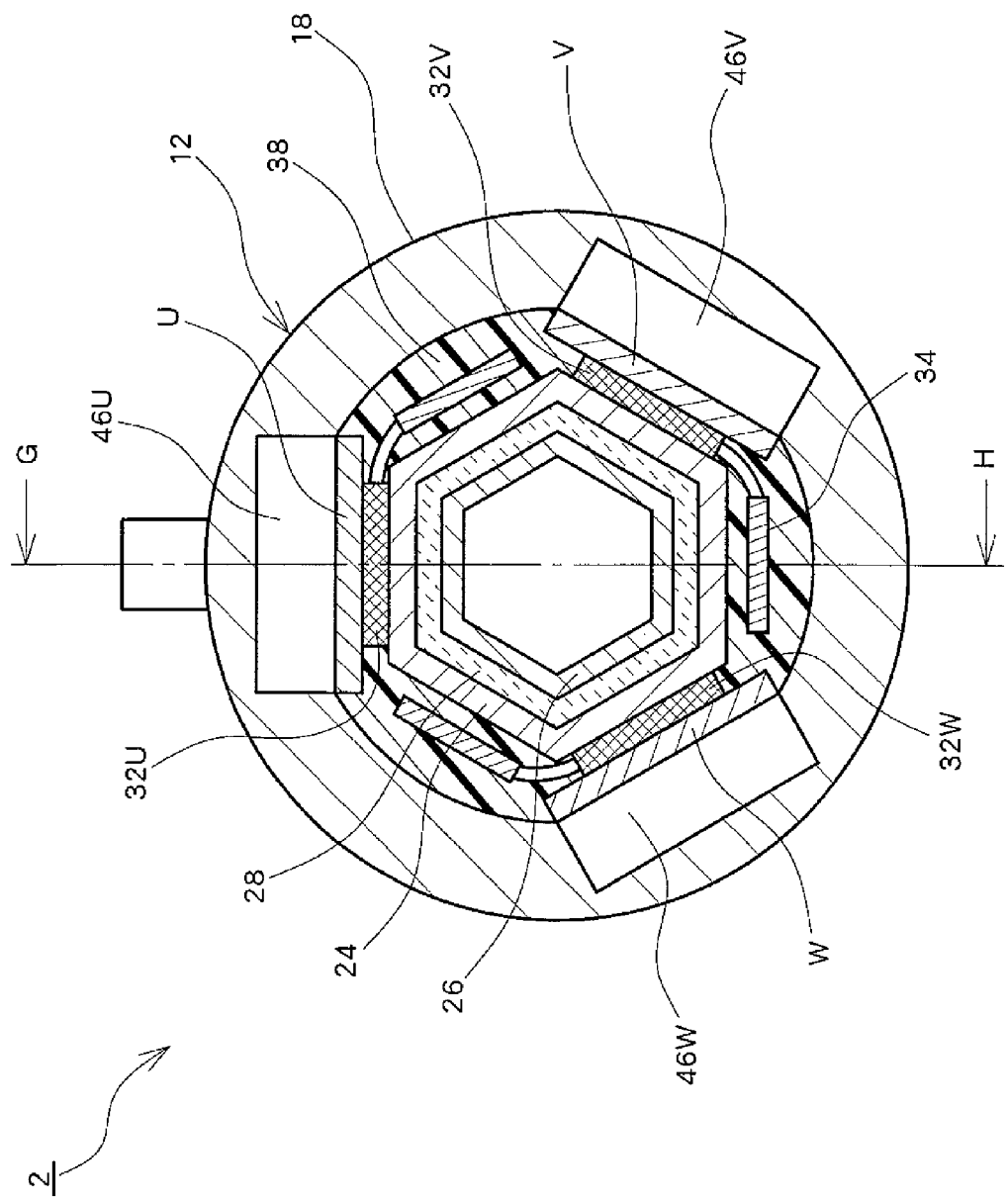
FIG. 6 is a cross-sectional view of a cooling-type switching element module according to a modification example.
Figure 7:
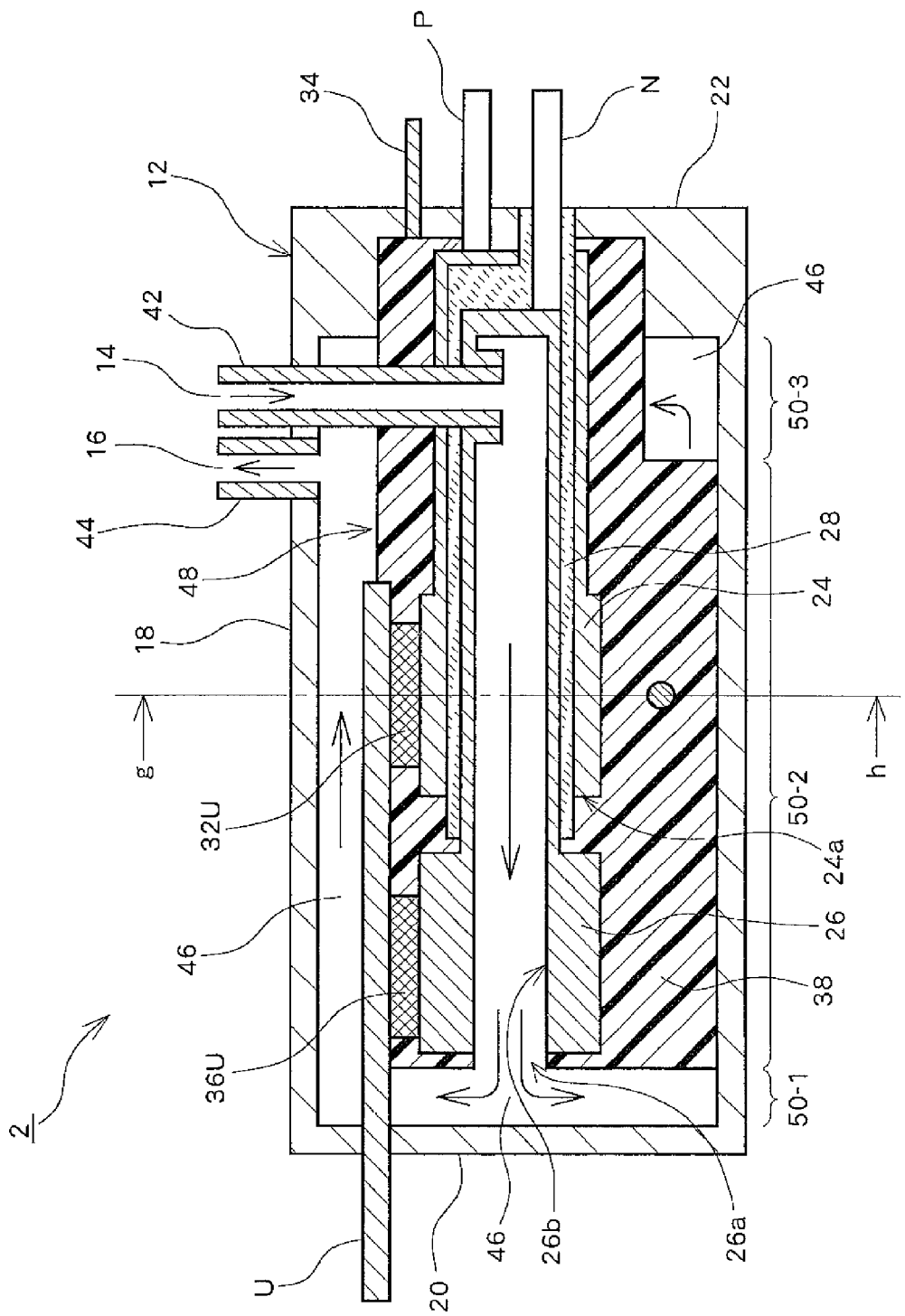
FIG. 7 is a cross-sectional view of the cooling-type switching element module according to the modification example.

A cooling-type switching element module according to a modification example will be described below. FIG. 6 shows a cross-sectional view of a cooling-type switching element module taken along a plane perpendicular to the longitudinal direction. FIG. 7 shows a cross-sectional view taken along line GH in FIG. 6. FIG. 6 is a cross-sectional view taken along line gh in FIG. 7. Components identical to those shown in FIGS. 1 to 5 are denoted by the same reference numerals, and their descriptions are not repeated here.

In this modification example, as shown in FIG. 6, the coolant flow channel is branched into narrow channels, and the branch coolant flow channels 46U, 46V, and 46W are provided at positions corresponding to the switching element pairs 40U, 40V, and 40W. The structure of the coolant flow channel 46 in a coolant flow zone 50-1 and a coolant flow zone 50-3 in FIG. 7 is similar to that of the coolant flow channel 46 shown in FIG. 2.

A structure for causing a coolant to flow will be described below with reference to FIG. 7. The coolant that has passed through an opening 26a of the inner conductor pipe 26, and has reached the coolant flow channel 46 between the first lid portion 20 and the molded body 48, branches to the coolant flow channels 46U, 46V, and 46W in a coolant flow zone 50-2. The coolant passes through the coolant flow channels 46U, 46V, and 46W, absorbs heat from the switching elements 32U, 32V, 32W, 36U, 36V, and 36W of the switching element pairs 40U, 40V, and 40W, joins into one in the coolant flow zone 50-3, and then passes through the outlet tube 44 to be emitted through the coolant outlet 16. It should be noted that the coolant may flow in the reverse direction.

By employing the above-described structure, because the rate of coolant flow in the branch coolant flow channels 46U, 46V, and 46W is increased on the condition that the rate of coolant flow through the coolant inlet 14 and the coolant outlet 16 per unit time is constant, the cooling performance is enhanced.

Figure 8:
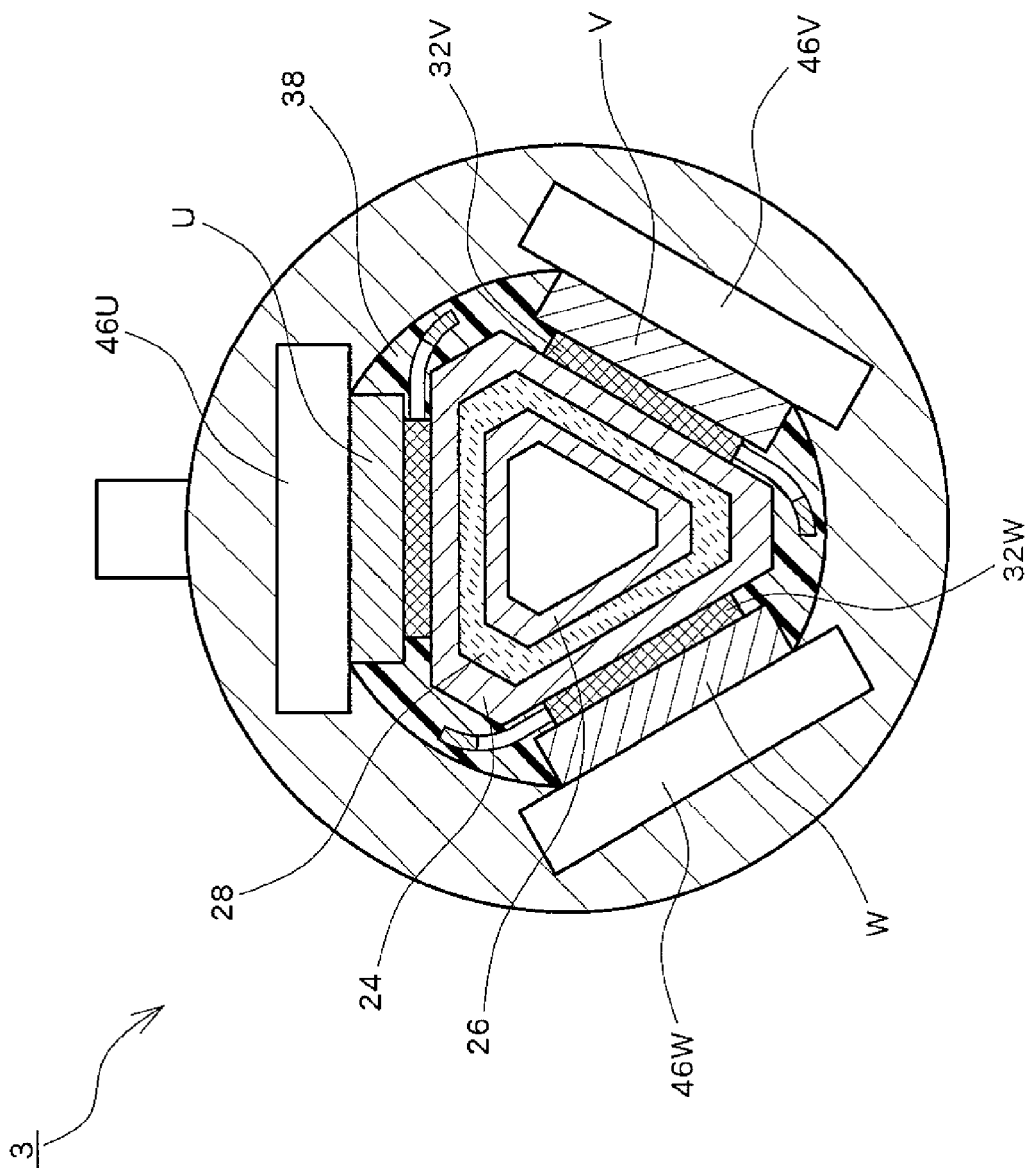
FIG. 8 is a cross-sectional view of the cooling-type switching element module according to the modification example.

The foregoing description has described an example in which the outer conductor pipe 24 and the inner conductor pipe 26 are formed to have a hexagonal column shape. The outer conductor pipe 24 and the inner conductor pipe 26 may have a different polygonal column shape. FIG. 8 shows a cooling-type switching element module 3 which is similar to the cooling-type switching element module 2 shown in FIGS. 6 and 7, and in which the outer conductor pipe 24 and the inner conductor pipe 26 are replaced with those having a nearly triangle column shape. This nearly triangle column shape is formed by narrowing the width of every other adjacent side surface of six side surfaces that form a regular hexagonal column shape to make it resemble a triangle column shape. When the outer conductor pipe 24 and the inner conductor pipe 26 have a nearly triangle column shape, the rate of coolant flow is increased compared with the outer conductor pipe 24 and the inner conductor pipe 26 having a hexagonal column shape on the condition that the rate of coolant flow through the coolant inlet 14 and the coolant outlet 16 per unit time is constant, and the cooling performance is enhanced.

It should be noted that, not only for the cooling-type switching element module 2 shown in FIGS. 6 and 7 but also for the cooling-type switching element module 1 shown in FIGS. 2 to 4, the outer conductor pipe 24 and the inner conductor pipe 26 may be replaced with those having a nearly triangle column shape.

An application example of a cooling-type switching element module will be described below. Hybrid electric vehicles and the like often use a plurality of motor generators. Hybrid electric vehicles that are being developed in recent years include, for example, a motor generator for use in electric power generation, and a motor generator for use in driving and regenerative braking. An inverter is connected to each of the motor generators.

Figure 9:
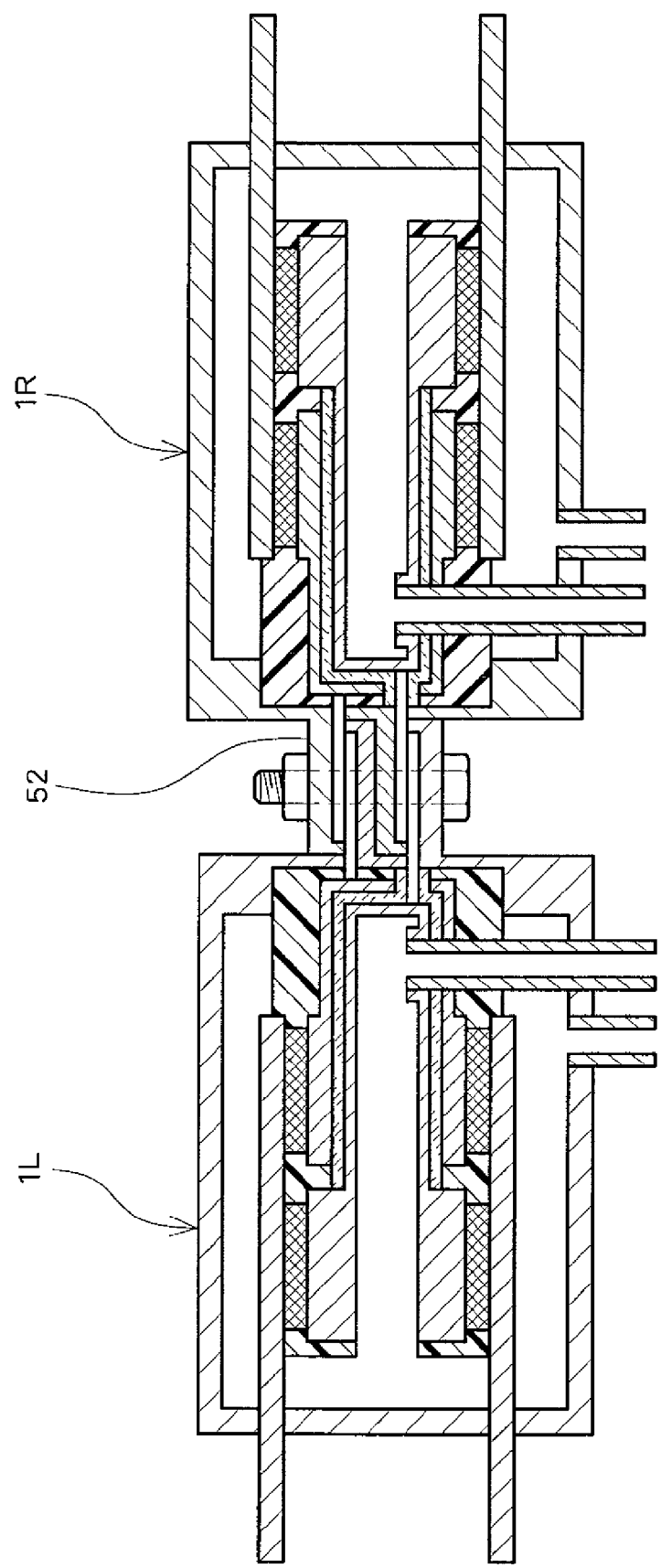
FIG. 9 is a cross-sectional view of a cooling-type switching element module according to an application example.

When, as described above, two motor generators are used, two cooling-type switching element modules may be used. FIG. 9 shows a cross-sectional view of two cooling-type switching element modules that are sectioned at an angle as in FIG. 2. Cooling-type switching element modules 1L and 1R each have a structure similar to that of the cooling-type switching element module 1 shown in FIGS. 1 to 4, and are bilaterally symmetrically arranged except for a joint portion 52. Positive electrode conductors P and negative electrode conductors N of the two cooling-type switching element modules 1L and 1R are electrically connected in common.

Figure 10:
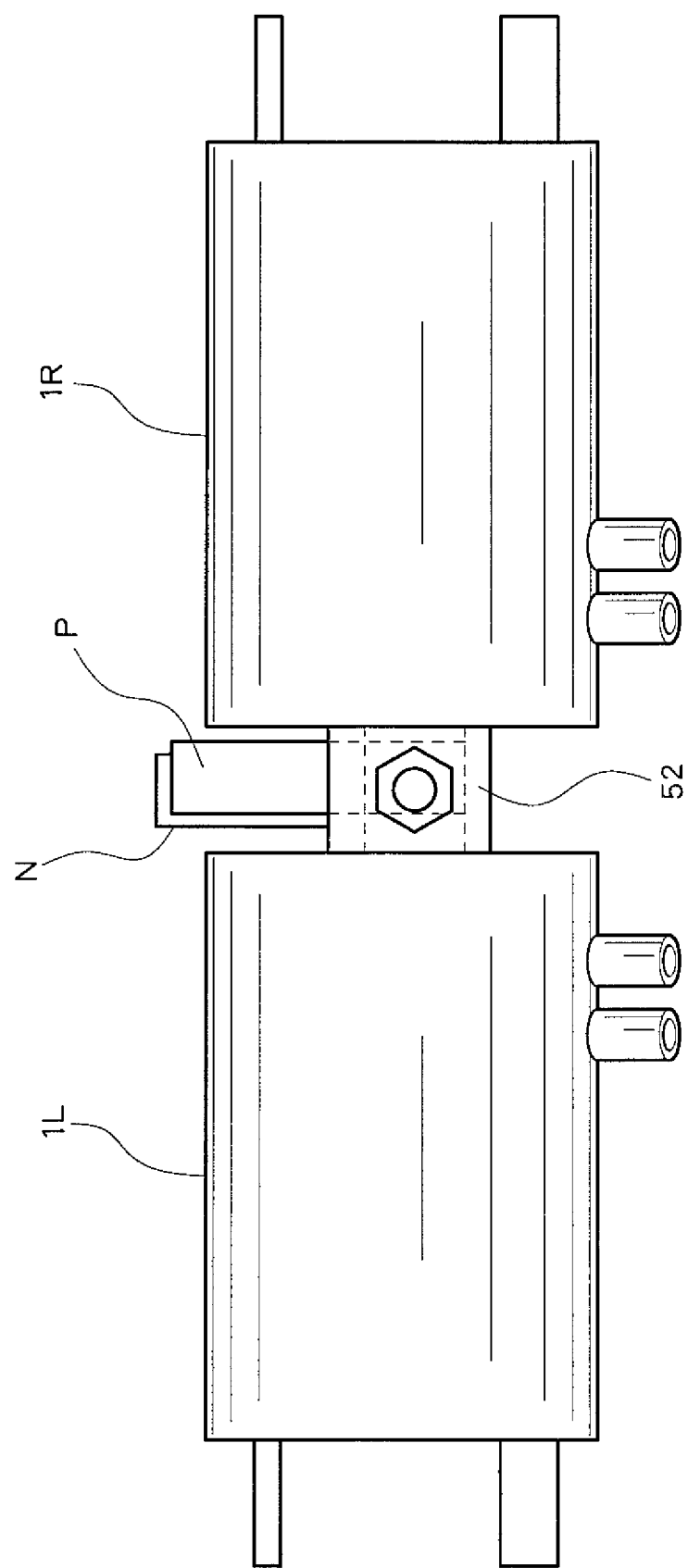
FIG. 10 is a top view of the cooling-type switching element module according to the application example.

FIG. 10 shows a top view of the cooling-type switching element modules 1L and 1R. The positive electrode conductor P that extends in the left direction from the cooling-type switching element module 1R located on the right side overlaps the positive electrode conductor P that extends in the right direction from the cooling-type switching element module 1L located on the left side and is terminated, and is elongated in the upward direction in FIG. 10 from the position at which the two positive electrode conductors P overlap each other. Also, the negative electrode conductor N that extends in the left direction from the cooling-type switching element module 1R located on the right side overlaps the negative electrode conductor N that extends in the right direction from the cooling-type switching element module 1L located on the left side and is terminated, and is elongated in the upward direction in FIG. 10 from the position at which the two negative electrode conductors N overlap each other. It should be noted that the positive electrode conductors P and the negative electrode conductors N that extend from the cooling-type switching element modules 1L and 1R may overlap each other in the opposite relationship. Further, the positive electrode conductor P that extends from the cooling-type switching element module 1L located on the left side may be configured to be elongated in the upward direction, and the negative electrode conductor N that extends from the cooling-type switching element module 1L located on the left side may be configured to be elongated in the upward direction.

Figure 11:
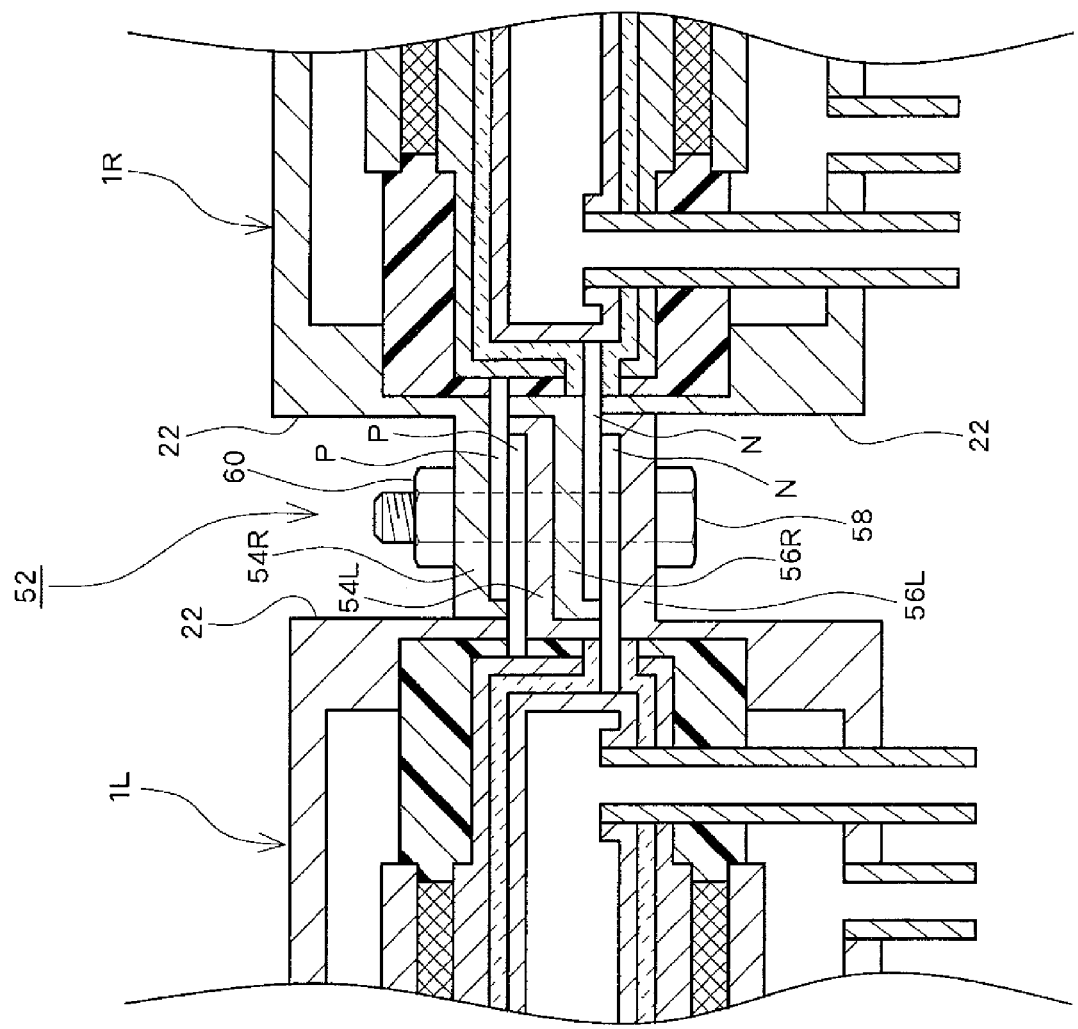
FIG. 11 is an enlarged view of a joint portion.

FIG. 11 shows an enlarged view of the joint portion 52. A positive electrode joint plate 54L for holding the positive electrode conductor P of the cooling-type switching element module 1L projects from the second lid portion 22 of the cooling-type switching element module 1L to extend in the right direction. The positive electrode conductor P of the cooling-type switching element module 1L is located on the upper surface of the positive electrode joint plate 54L. Also, a negative electrode joint plate 56L for holding the negative electrode conductor N of the cooling-type switching element module 1L projects from the second lid portion 22 of the cooling-type switching element module 1L to extend in the right direction. The negative electrode conductor N of the cooling-type switching element module 1L is located on the upper surface of the negative electrode joint plate 56L.

Similarly, a positive electrode joint plate 54R for holding the positive electrode conductor P of the cooling-type switching element module 1R projects from the second lid portion 22 of the cooling-type switching element module 1R to extend in the left direction. The positive electrode conductor P of the cooling-type switching element module 1R is located on the lower surface of the positive electrode joint plate 54R. Also, a negative electrode joint plate 56R for holding the negative electrode conductor N of the cooling-type switching element module 1R projects from the second lid portion 22 of the cooling-type switching element module 1R to extend in the left direction. The negative electrode conductor N of the cooling-type switching element module 1R is located on the lower surface of the negative electrode joint plate 56R.

The positive electrode joint plates 54L and 54R on both sides and the negative electrode joint plates 56R and 56L on both sides each have a bolt hole. Also, the positive electrode conductors P and the negative electrode conductors N on both sides each have a bolt hole. The cooling-type switching element modules 1L and 1R are fixed in a position in which the bolt holes of the positive electrode conductors P, the bolt holes of the negative electrode conductors N, the bolt holes of the positive electrode joint plates, and the bolt holes of the negative electrode joint plates match with each other. A bolt 58 is inserted into the bolt holes, and the positive electrode joint plates on both sides and the negative electrode joint plates on both sides are joined to each other by means of the bolt 58 and a nut 60. This brings the positive electrode conductors P on both sides and the negative electrode conductors N on both sides into electrical contact with each other. It should be noted that, when the bolt 58 is formed of a conductive material, the bolt 58 is insulated from the positive electrode conductors P, and the bolt 58 is insulated from the negative electrode conductors N.

By employing the above-described structure, when an inverter is provided for each of two motor generators, it is possible to achieve improved cooling performance and electrical performance of the inverters, downsizing, and reduction in the number of components and the costs.

Figure 12:
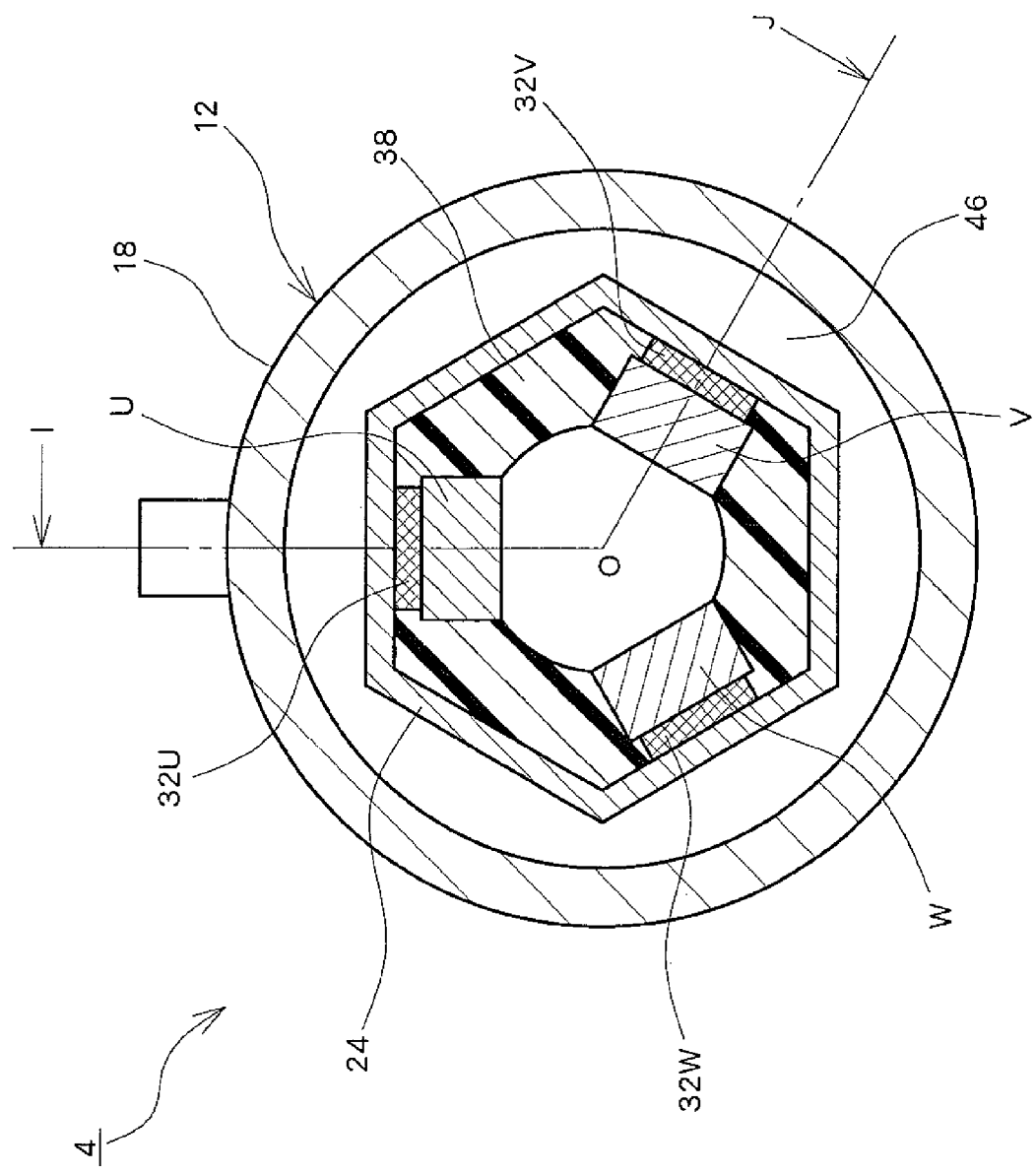
FIG. 12 is a cross-sectional view of a cooling-type switching element module according to a second embodiment.
Figure 13:
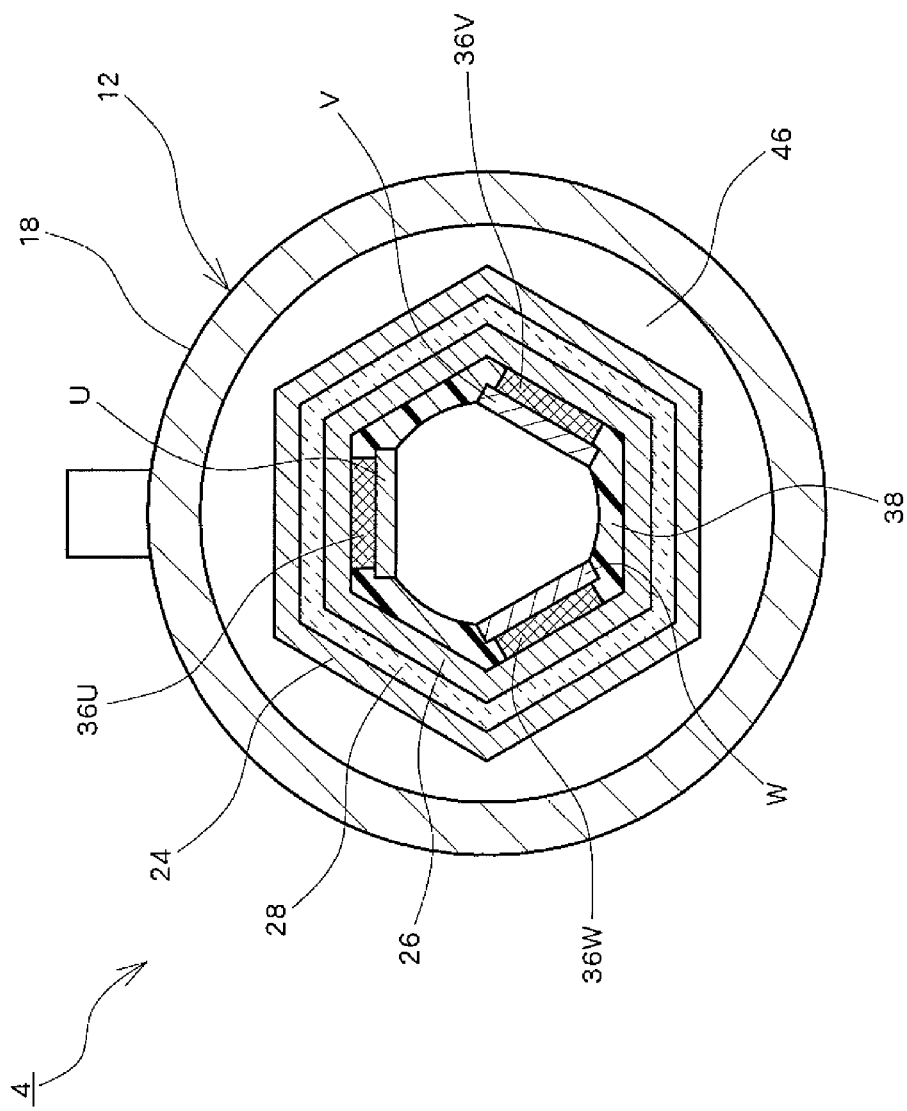
FIG. 13 is a cross-sectional view of the cooling-type switching element module according to the second embodiment.
Figure 14:
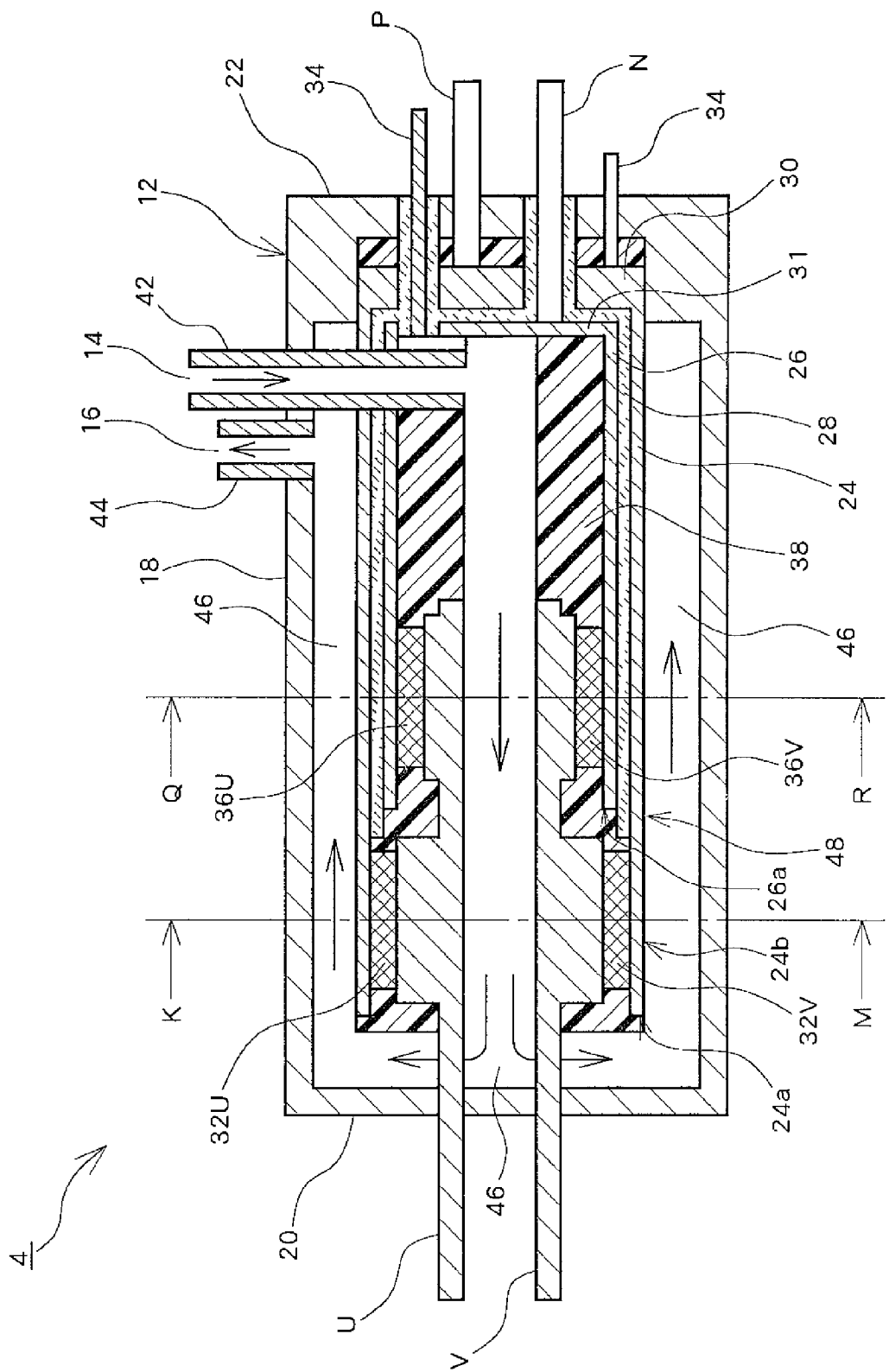
FIG. 14 is a cross-sectional view of the cooling-type switching element module according to the second embodiment.

A cooling-type switching element module according to a second embodiment will be described below. FIGS. 12 and 13 shows a cross-sectional view of a cooling-type switching element module 4 taken along a plane perpendicular to the longitudinal direction. FIG. 14 shows a cross-sectional view taken along line IOJ in FIG. 12. FIG. 12 is a cross-sectional view taken along line KM in FIG. 14, and FIG. 13 is a cross-sectional view taken along line QR in FIG. 14. Components identical to those shown in FIGS. 1 to 5 are denoted by the same reference numerals, and their descriptions are not repeated here.

In this embodiment, the outer conductor pipe 24 is extended from a position in which an opening 26a of the inner conductor pipe 26 is located. The first switching elements 32U, 32V, and 32W are provided inside the extension portion 24b of the outer conductor pipe 24, and the second switching elements 36U, 36V, and 36W are provided inside the inner conductor pipe 26.

As shown in FIGS. 12 to 14, the outer conductor pipe 24 and the inner conductor pipe 26 are arranged within the housing 12 to share the same axis with the pipe portion 18. The outer conductor pipe 24 and the inner conductor pipe 26 have a hexagonal column shape, and are arranged such that the side surfaces are parallel to each other. An insulating layer 28 is provided between the outer conductor pipe 24 and the inner conductor pipe 26. The inner conductor pipe 26 is located inside the outer conductor pipe 24, and the outer conductor pipe 24 has a extension portion 24b extending from the position at which the opening 26a of the inner conductor pipe 26 is located.

As shown in FIG. 12, the first switching elements 32U, 32V, and 32W are arranged on every other side surface of the hexagonal column shape inside the extension portion of the outer conductor pipe 24. One of the plate surfaces of each first switching element faces a side surface of the outer conductor pipe 24, and is attached to the side surface of the outer conductor pipe 24. The terminal of each first switching element that is located closer to the outer conductor pipe 24 is electrically connected to the side surface of the outer conductor pipe 24 by soldering or another method.

As the first switching elements 32U, 32V, and 32W, for example, an IGBT is used. In this case, the plate surface on which a collector terminal is provided faces the outer conductor pipe 24, and the plate surface on which an emitter terminal is provided faces opposite the outer conductor pipe 24 side.

As shown in FIG. 13, the second switching elements 36U, 36V, and 36W are arranged on every other side surface of the hexagonal column shape inside the portion of the inner conductor pipe 26 that forms a double-layer structure in conjunction with the outer conductor pipe 24. One of the plate surfaces of each second switching element 36U, 36V, or 36W faces a side surface of the inner conductor pipe 26, and is attached to the side surface of the inner conductor pipe 26. The terminal of each second switching element that is located closer to the inner conductor pipe 26 is electrically connected to the side surface of the inner conductor pipe 26 by soldering or another method.

As the second switching elements, for example, an IGBT is used. In this case, the plate surface on which an emitter terminal is provided faces the inner conductor pipe 26, and the plate surface on which a collector terminal is provided faces opposite the inner conductor pipe 26 side.

As shown in FIG. 14, the thicknesses of the U phase conductor, the V phase conductor, and the W phase conductor are increased in an outward direction in portions that are attached to the respectively corresponding first switching elements 32U, 32V, and 32W and the respectively corresponding second switching elements 36U, 36V, and 36W. Each of the first switching elements 32U, 32V, and 32W and the second switching elements 36U, 36V, and 36W in the respective phases has an inner surface to which one of the phase conductors corresponding to the respective phases is attached. In other words, the first switching elements 32Y, 32V, and 32W are interposed between one of the phase conductors and the extension portion of the outer conductor pipe 24, and the second switching elements 36U, 36V, and 36W are interposed between one of the phase conductors and the inner conductor pipe 26. The phase conductors are electrically connected to the terminals provided on the inner surfaces of the first switching elements 32U, 32V, and 32W and the second switching elements 36U, 36V, and 36W by soldering or another method.

The phase conductors are elongated in the left direction, and pierce the first lid portion 20 to extend to the outside of the housing 12. When the first lid portion 20 is formed of a conductive material, the phase conductors and the first lid portion 20 are electrically insulated from each other. In this case, an insulator material is provided between the phase conductors and the first lid portion 20.

The outer conductor pipe 24, the inner conductor pipe 26, the insulating layer 28, the first switching elements 32U, 32V, and 32W, the second switching elements 36U, 36V, and 36W, and the phase conductors are molded by a molding resin 38 within the outer conductor pipe 24 and the inner conductor pipe 26, and integrated as a molded body 48. The thickness of a right end portion of the side wall of the pipe portion 18 is increased in an inward direction to reduce the inner diameter. The molded body 48 is attached to the housing 12 at a portion in which the inner diameter in the right end of the pipe portion 18 is reduced.

A structure for causing a coolant to flow will be described below. An inlet tube 42 is inserted through the side surface of the housing 12. The inlet tube 42 pierces the side wall of the pipe portion 18, the coolant flow channel 46, the side wall of the outer conductor pipe 24, the side wall of the inner conductor pipe 26, and the molding resin 38, and communicates with the inside of the inner conductor pipe 26. Further, an outlet tube 44 is inserted through the side surface of the housing 12, and communicates with the coolant flow channel 46. One end of the inlet tube 42 that is present outside the housing 12 forms the coolant inlet 14, and one end of the outlet tube 44 that is present outside the housing 12 forms the coolant outlet 16.

The coolant that has entered through the coolant inlet 14 passes through the inlet tube 42, and reaches the inside of the inner conductor pipe 26. The coolant passes through the inside of the inner conductor pipe 26 and the inside of the extension portion of the outer conductor pipe 24 while absorbing heat from the second switching elements 36U, 36V, and 36W and the first switching elements 32U, 32V, and 32W of the switching element pairs 40U, 40V, and 40W, and reaches the coolant flow channel 46 through the outer conductor pipe 24. The coolant passes through the coolant flow channel 46 that is present between the first lid portion 20 and the molded body 48, and reaches the coolant flow channel 46 that is present between the pipe portion 18 and the outer conductor pipe 24. The coolant passes through the coolant flow channel 46 that is present between the pipe portion 18 and the molded body 48 while absorbing heat from the first switching elements 32U, 32V, and 32W and the second switching elements 36U, 36V, and 36W of the switching element pairs 40U, 40V, and 40W, and then passes through the outlet tube 44 to be emitted through the coolant outlet 16. It should be noted that the coolant may flow in the reverse direction.

By employing the above-described structure, advantages similar to those of the first embodiment are achieved. More specifically, the advantages achieved not only include advantages of, for example, prevention of a surge voltage from occurring in the inverter and stabilization of the alternating current voltage, but also include advantages of, for example, enhancement in the cooling effect, downsizing of the cooling-type switching element module, and reduction in the number of components and the costs.

Figure 15:
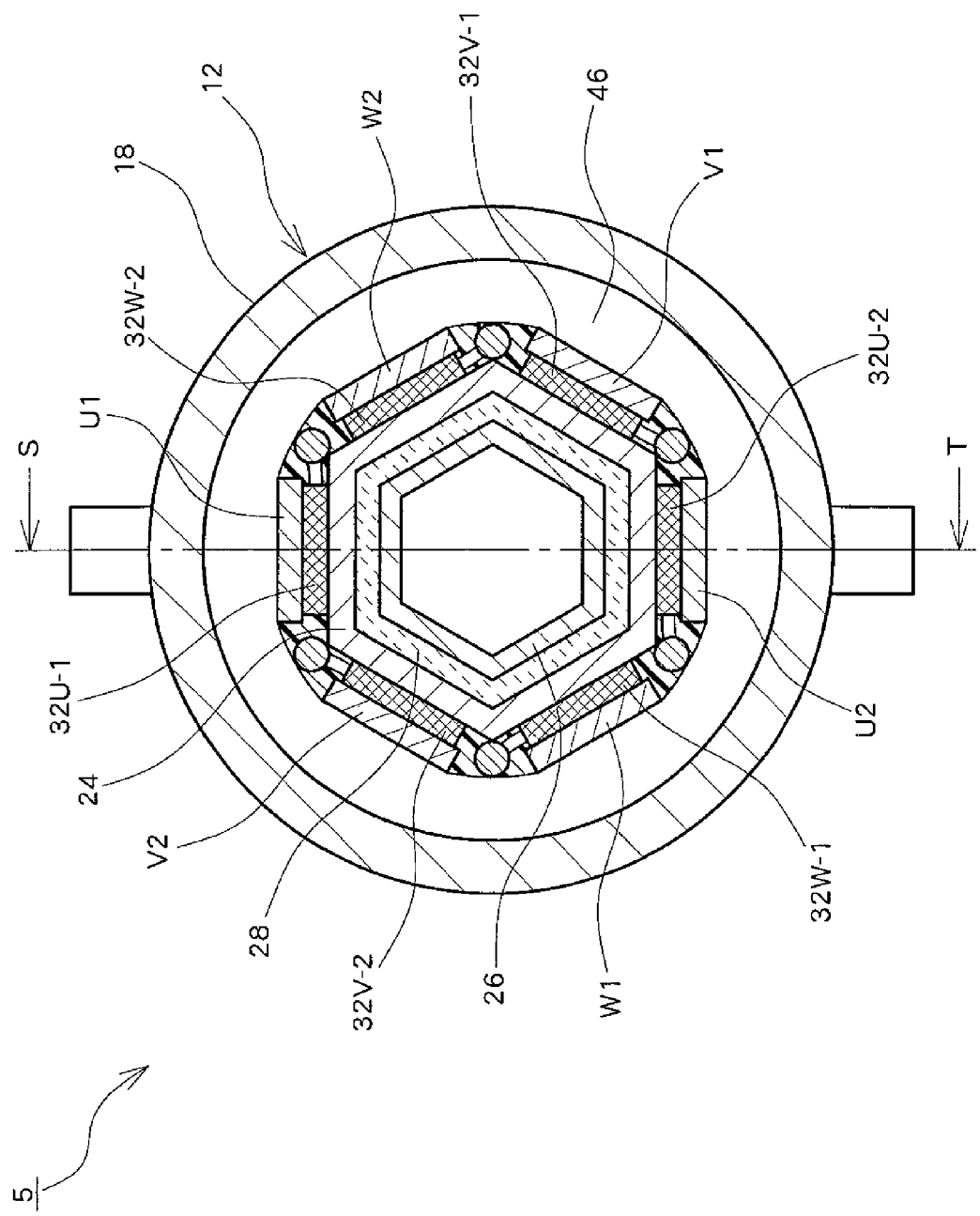
FIG. 15 is a cross-sectional view of a cooling-type switching element module according to a third embodiment.
Figure 16:
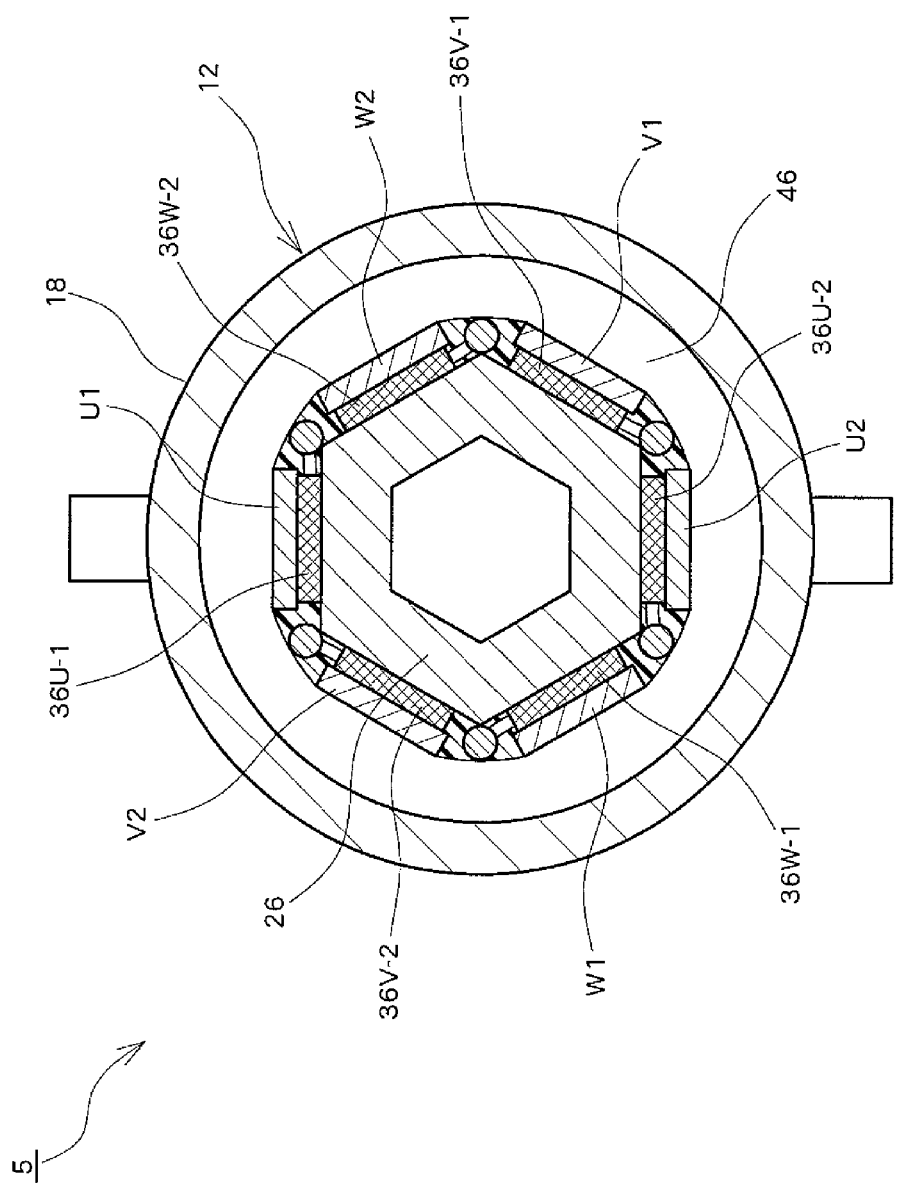
FIG. 16 is a cross-sectional view of the cooling-type switching element module according to the third embodiment.
Figure 17:
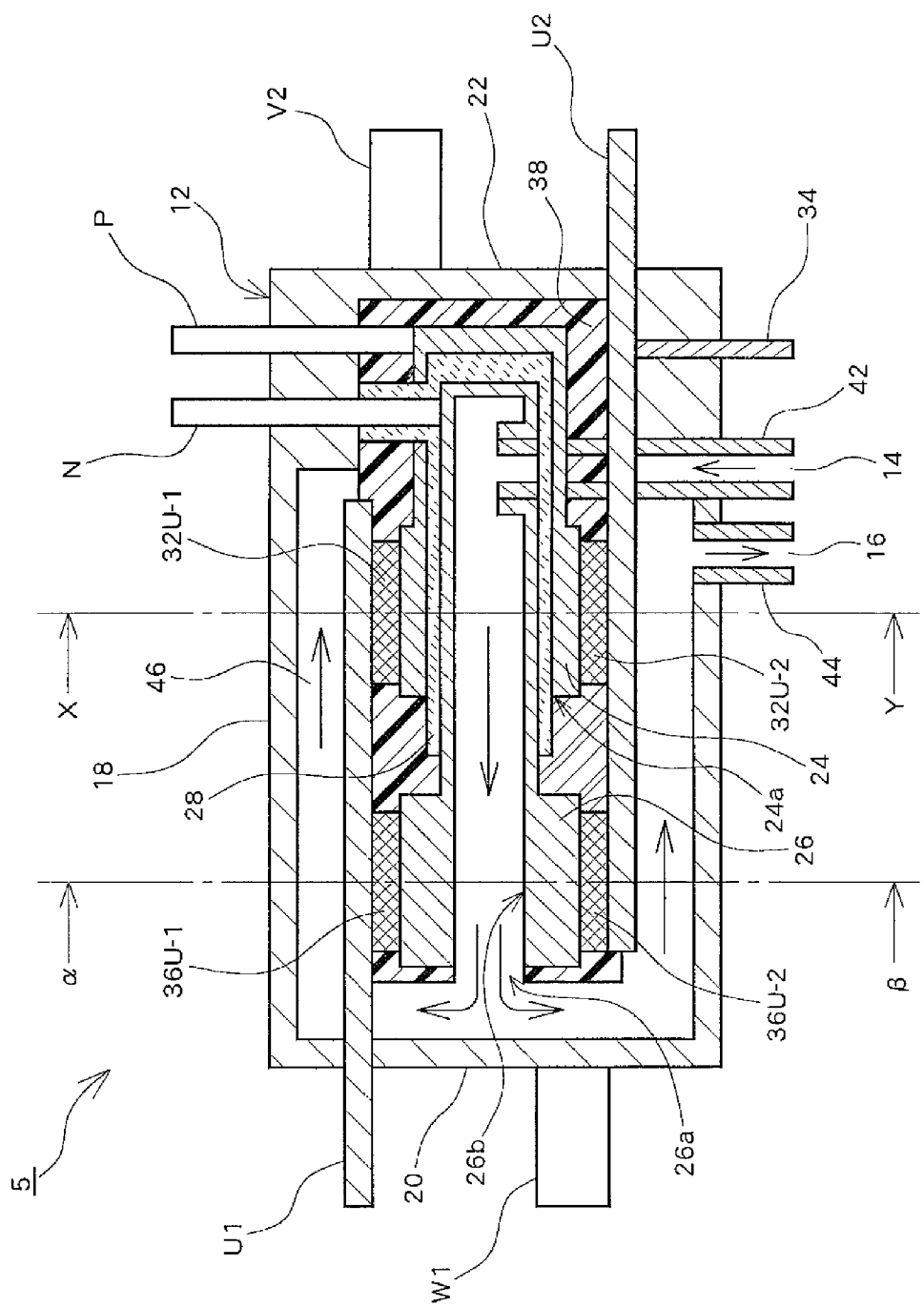
FIG. 17 is a cross-sectional view of the cooling-type switching element module according to the third embodiment.

Next, a cooling-type switching element module according to a third embodiment will be described below. FIGS. 15 and 16 show a cross-sectional view of a cooling-type switching element module 5 taken along a plane perpendicular to the longitudinal direction. FIG. 17 shows a cross-sectional view taken along line ST in FIG. 15. FIG. 15 is a cross-sectional view taken along line XX in FIG. 17, and FIG. 16 is a cross-sectional view taken along line αβ in FIG. 17.

In this embodiment, switching elements constituting two inverters are housed in a single housing 12. Components identical to those shown in FIGS. 1 to 5 are denoted by the same reference numerals, and their descriptions are not repeated here.

As shown in FIG. 15, first switching elements 32U-1, 32V-1, and 32W-1 of a first inverter are arranged on every other side surface (three surfaces that are not adjacent to each other) of a portion of the outer conductor pipe 24 that forms a double-layer structure in conjunction with the inner conductor pipe 26. Further, a first switching element 32U-2 of a second inverter is provided on a side surface that is located opposite the side surface on which the first switching element 32U-1 of the first inverter is provided. Similarly, a first switching element 32V-2 of the second inverter is provided on a side surface that is located opposite the side surface on which the first switching element 32V-1 of the first inverter is provided, and a first switching element 32W-2 of the second inverter is provided on a side surface that is located opposite the side surface on which the first switching element 32W-1 of the first inverter is provided. Thus, the first switching elements 32U-1, 32V-1, and 32W-1 of the first inverter and the first switching elements 32U-2, 32V-2, and 32W-2 of the second inverter are arranged at positions rotationally symmetric by 180°. In other words, the first switching elements of the first inverter and the first switching elements of the second inverter are provided on adjacent side surfaces, and are alternately arranged in the order of 32U-1, 32W-2, 32V-1, 32U-2, 32W-1, and 32V-2 in a clockwise direction.

As shown in FIG. 16, second switching elements 36U-1, 36V-1, and 36W-1 of the first inverter are arranged on every other side surface of the projecting portion of the inner conductor pipe 26. Further, a second switching element 36U-2 of the second inverter is provided on a side surface that is located opposite the side surface on which the second switching element 36U-1 of the first inverter is provided. Similarly, a second switching element 36V-2 of the second inverter is provided on a side surface that is located opposite the side surface on which the second switching element 36V-1 of the first inverter is provided, and a second switching element 36W-2 of the second inverter is provided on a side surface that is located opposite the side surface on which the second switching element 36W-1 of the first inverter is provided. Thus, the second switching elements 36U-1, 36V-1, and 36W-1 of the first inverter and the second switching elements 36U-2, 36V-2, and 36W-2 of the second inverter are arranged at positions rotationally symmetric by 180°. In other words, the second switching elements of the first inverter and the second switching elements of the second inverter are provided on adjacent side surfaces, and are alternately arranged in the order of 36U-1, 36W-2, 36V-1, 36U-2, 36W-1, and 36V-2 in a clockwise direction.

It should be noted that it is not necessarily required that the switching element pairs of the first inverter and the switching element pairs of the second inverter be alternately arranged along the perimeter of the outer conductor pipe 24 and the inner conductor pipe, but the order of arrangement may be changed in accordance with the design.

As shown in FIG. 17, a U phase conductor U1, a V phase conductor V1, and a W phase conductor W1 of the first inverter are elongated in the left direction, and pierce the first lid portion 20 to extend to the outside of the housing 12. When the first lid portion 20 is formed of a conductive material, the phase conductors of the first inverter and the first lid portion 20 are electrically insulated from each other. In this case, an insulator material is provided between the phase conductors of the first inverter and the first lid portion 20.

A U phase conductor U2, a V phase conductor V2, and a W phase conductor W2 of the second inverter are elongated in the right direction, and pierce the second lid portion 22 to extend to the outside of the housing 12. When the second lid portion 22 is formed of a conductive material, the phase conductors of the second inverter and the second lid portion 22 are electrically insulated from each other. In this case, an insulator material is provided between the phase conductors of the second inverter and the second lid portion 22.

In the present embodiment, three-phase conductors extend from both ends of the housing 12. The positive electrode conductor P and the negative electrode conductor N are therefore inserted into the housing 12 by means of a structure as will be described below. The positive electrode conductor P pierces the pipe portion 18 and the molding resin 38, and is joined to the outer conductor pipe 24. When the pipe portion 18 is formed of a conductive material, the positive electrode conductor P and the pipe portion 18 are electrically insulated from each other. In this case, an insulator material is provided between the positive electrode conductor P and the pipe portion 18. Also, the negative electrode conductor N pierces the pipe portion 18, the molding resin 38, and the outer conductor pipe 24, and is joined to the inner conductor pipe 26. When the pipe portion 18 is formed of a conductive material, the negative electrode conductor N and the pipe portion 18 are electrically insulated from each other. In this case, an insulator material is provided between the negative electrode conductor N and the pipe portion 18. Further, an insulator material is provided between the negative electrode conductor N and the outer conductor pipe 24, and the negative electrode conductor N and the outer conductor pipe 24 are electrically insulated from each other.

By employing the above-described structure, advantages similar to the advantages achieved in the first embodiment can be achieved, and switching elements constituting two inverters can be housed in a single housing. As a result, it is possible to achieve improved cooling performance and electrical performance of the two inverters, downsizing, and reduction in the number of components and the costs.

The foregoing description has described embodiments in which inverters are housed. The present invention can be employed in a step-up/step-down converter that steps up or steps down a direct current voltage, or other electric power conversion circuits including switching element pairs.

Also, the present invention may be employed not only in an inverter that performs dc-ac conversion between direct current electric power and three-phase alternating current electric power, but also in an inverter that performs dc-ac conversion between direct current electric power and single-phase alternating current electric power, or between direct current electric power and polyphase alternating current electric power having four or more phases.

The foregoing description has described embodiments in which a coolant is caused to flow in a direction from the inside of the inner conductor pipe 26 toward the coolant flow channel 46. It should be noted that the coolant may flow in the reverse direction. In this case, the above-described outlet tube 44 is used as an inlet tube, and the above-described inlet tube 42 is used as an outlet tube.

Further, fins for increasing the heat transfer area may be provided on the wall surface of the channel through which the coolant flows in the cooling-type switching element module. Further, turbulence of the flow of the coolant or boiling of the coolant may be caused by, for example, forming a projection, a groove, or the like on the wall surface of the channel through which the coolant flows, or applying porous surface treatment. This is because turbulence of the flow of the coolant or boiling of the coolant can in some cases improve the cooling performance.

The foregoing description has further described embodiments in which the pipe portion 18, the outer conductor pipe 24, and the inner conductor pipe 26 are coaxially arranged. Not only such structures, but also structures in which the center axis of one of the pipe portion 18, the outer conductor pipe 24, and the inner conductor pipe 26 is shifted from the other center axes may be employed in accordance with the design. Further, these pipe-shaped components may have a shape that is rotationally non-symmetric with respect to the center axis.

The foregoing description has also described embodiments in which the positive electrode conductor P is connected to the outer conductor pipe 24, and the negative electrode conductor N is connected to the inner conductor pipe 26. Not only such structures, but also structures in which the negative electrode conductor N is connected to the outer conductor pipe 24, and the positive electrode conductor P is connected to the inner conductor pipe 26 may be employed. In this case, the connection of the terminals of the switching elements is modified in accordance with the polarity of direct current voltage.

The foregoing description has further described that each of the positive electrode conductor P, the negative electrode conductor N, the U phase conductor, the V phase conductor, and the W phase conductor is formed of a metal strip. These conductors may have a circular or a polygonal cross section other than hexagonal.

What is claimed is:

1. A cooling-type switching element module, comprising:
   an outer conductor pipe;
   an inner conductor pipe that is at least partially located within the outer conductor pipe, and transmits electric power in conjunction with the outer conductor pipe; and
   a plurality of first switching elements and a plurality of second switching elements, wherein
   the inner conductor pipe has a projecting portion that projects from an opening of the outer conductor pipe,
   each of the first switching element is provided on an outer surface of the outer conductor pipe,
   each of the second switching element is provided on an outer surface of the projecting portion, and
   a coolant flows within the inner conductor pipe, outside the projecting portion, and outside the outer conductor pipe.

2. The cooling-type switching element module according to claim 1, further comprising:
   a conductor having one of the first switching elements interposed between the conductor and the outer conductor pipe, and having one of the second switching elements interposed between the conductor and the projecting portion.

3. The cooling-type switching element module according to claim 1, wherein
   there are a plurality of switching element pairs, each pair composed of one of the first switching elements and one of the second switching elements,
   the first switching element and the second switching element in each switching element pair are aligned in a longitudinal direction of the outer conductor pipe and the inner conductor pipe, and
   the plurality of switching element pairs are arranged in a circumferential direction of the inner conductor pipe and the outer conductor pipe with the first switching element and the second switching element forming each pair being arranged in the same direction.

4. The cooling-type switching element module according to claim 3, wherein
   each of the outer conductor pipe and the inner conductor pipe has a polygonal column shape, and one of the switching element pairs is provided on one flat side surface of the outer conductor pipe and the inner conductor pipe.

5. The cooling-type switching element module according to claim 4, wherein the switching element pairs comprise:
a plurality of switching element pairs constituting a first inverter; and
a plurality of switching element pairs constituting a second inverter, wherein
the switching element pairs constituting the first inverter and the switching element pairs constituting the second inverter are provided on adjacent flat side surfaces of the outer conductor pipe and the inner conductor pipe.

6. A cooling-type switching element module, comprising:
an outer conductor pipe;
an inner conductor pipe that is located within the outer conductor pipe, and transmits electric power in conjunction with the outer conductor pipe; and
a plurality of first switching elements and a plurality of second switching elements, wherein
the outer conductor pipe has an extension portion that is extended from a position located on one end of the inner conductor pipe,
each of the first switching elements is provided on an inner surface of the extension portion,
each of the second switching elements is provided on an inner surface of the inner conductor pipe, and
a coolant flows within the inner conductor pipe, within the extension portion, and outside the outer conductor pipe.

7. The cooling-type switching element module according to claim 6, further comprising:
a conductor having one of the first switching elements interposed between the conductor and the extension portion, and having one of the second switching elements interposed between the conductor and the inner conductor pipe.

8. The cooling-type switching element module according to claim 6, wherein
there are a plurality of switching element pairs, each pair composed of one of the first switching elements and one of the second switching elements,
the first switching element and the second switching element in each switching element pair are aligned in a longitudinal direction of the outer conductor pipe and the inner conductor pipe, and
the plurality of switching element pairs are arranged in a circumferential direction of the inner conductor pipe and the outer conductor pipe with the first switching element and the second switching element forming each pair being arranged in the same direction.

9. The cooling-type switching element module according to claim 8, wherein
each of the outer conductor pipe and the inner conductor pipe has a polygonal column shape, and
one of the switching element pairs is provided on one flat side surface of the outer conductor pipe and the inner conductor pipe.

10. The cooling-type switching element module according to claim 9, wherein the switching element pairs comprise:
a plurality of switching element pairs constituting a first inverter; and
a plurality of switching element pairs constituting a second inverter, wherein
the switching element pairs constituting the first inverter and the switching element pairs constituting the second inverter are provided on adjacent flat side surfaces of the outer conductor pipe and the inner conductor pipe.

* * * * *